(12) United States Patent
Oosuka et al.

(10) Patent No.: US 8,350,332 B2
(45) Date of Patent: Jan. 8, 2013

(54) SEMICONDUCTOR DEVICE AND METHOD OF MANUFACTURING THE SAME

(75) Inventors: Tsutomu Oosuka, Toyama (JP); Yoshihiro Sato, Hyogo (JP); Hisashi Ogawa, Osaka (JP)

(73) Assignee: Panasonic Corporation, Osaka (JP)

(*) Notice: Subject to any disclaimer, the term of this patent is extended or adjusted under 35 U.S.C. 154(b) by 192 days.

(21) Appl. No.: 12/619,222

(22) Filed: Nov. 16, 2009

(65) Prior Publication Data
US 2010/0059827 A1 Mar. 11, 2010

Related U.S. Application Data

(63) Continuation of application No. PCT/JP2009/000184, filed on Jan. 20, 2009.

(30) Foreign Application Priority Data

Mar. 14, 2008 (JP) ................................. 2008-066543

(51) Int. Cl.
*H01L 27/092* (2006.01)
(52) U.S. Cl. .. 257/369; 257/368; 257/377; 257/E27.062
(58) Field of Classification Search .................. 257/369, 257/368, 377, E27.062
See application file for complete search history.

(56) References Cited

U.S. PATENT DOCUMENTS

| | | | |
|---|---|---|---|
| 2003/0003666 A1 | 1/2003 | Iriyama et al. | |
| 2005/0064636 A1* | 3/2005 | Cabral et al. | 438/184 |
| 2006/0192258 A1 | 8/2006 | Tsuchiya et al. | |
| 2007/0007602 A1 | 1/2007 | Oda et al. | |
| 2007/0059872 A1* | 3/2007 | Visokay et al. | 438/197 |
| 2007/0105317 A1 | 5/2007 | Nakajima | |
| 2007/0152276 A1 | 7/2007 | Arnold et al. | |
| 2007/0284671 A1 | 12/2007 | Tsutsumi et al. | |
| 2008/0017936 A1* | 1/2008 | Buchanan et al. | 257/411 |
| 2008/0121999 A1* | 5/2008 | Kawahara et al. | 257/366 |
| 2009/0039441 A1* | 2/2009 | Luna et al. | 257/383 |

FOREIGN PATENT DOCUMENTS

| | | |
|---|---|---|
| JP | 2007-19396 | 1/2007 |
| JP | 2007-184583 | 7/2007 |
| JP | 2008-034751 | 2/2008 |
| JP | 2008-034751 A | 2/2008 |
| WO | WO 01/71807 A1 | 9/2001 |

OTHER PUBLICATIONS

Song, S.C., et al., "Highly Manufacturable 45nm LSTP CMOSFETs Using Novel Dual High-k and Dual Metal Gate CMOS Integration", 2006 Symposium on VLSI Technology Digest of Technical Papers, IEEE.

* cited by examiner

*Primary Examiner* — Minchul Yang
(74) *Attorney, Agent, or Firm* — McDermott Will & Emery LLP

(57) ABSTRACT

A first and second gate electrodes are formed on a first and second active regions, respectively. The first and second gate electrodes have a first and second metal-containing conductive films, respectively. The first and second metal-containing conductive films are formed on the isolation region for segmenting the first and second active regions to be spaced apart from each other. A third metal-containing conductive film, which is a part of each of the first and second gate electrodes, is continuously formed from a top of the first metal-containing conductive film through a top of the isolation region to a top of the second metal-containing conductive film. The third metal-containing conductive film is in contact with the first and second metal-containing conductive films.

25 Claims, 16 Drawing Sheets

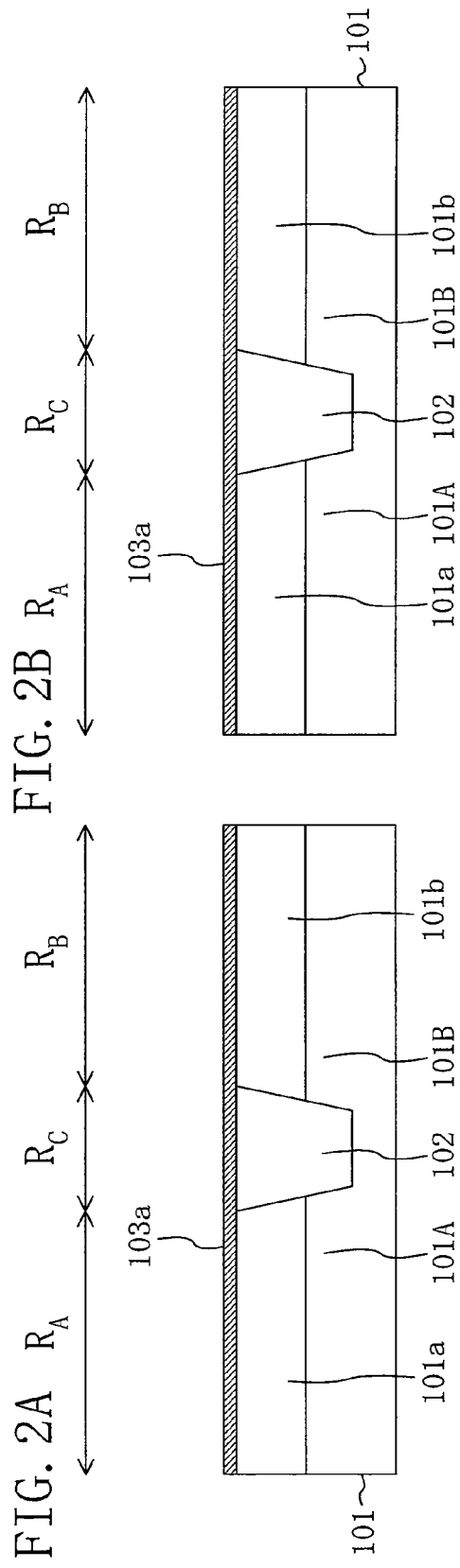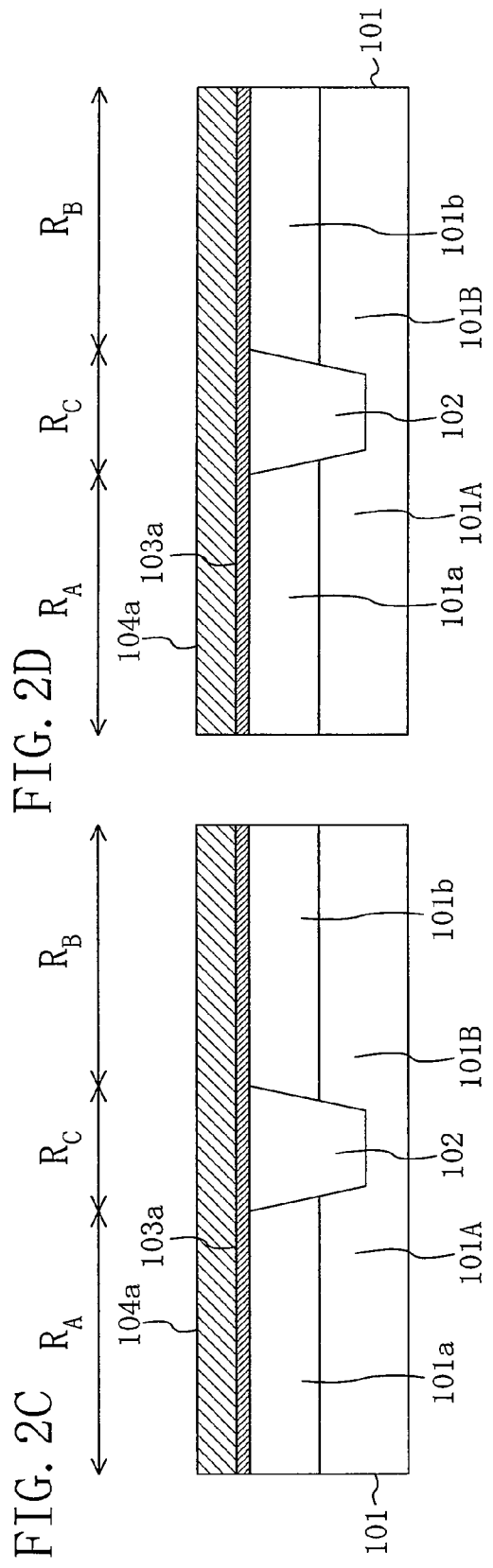

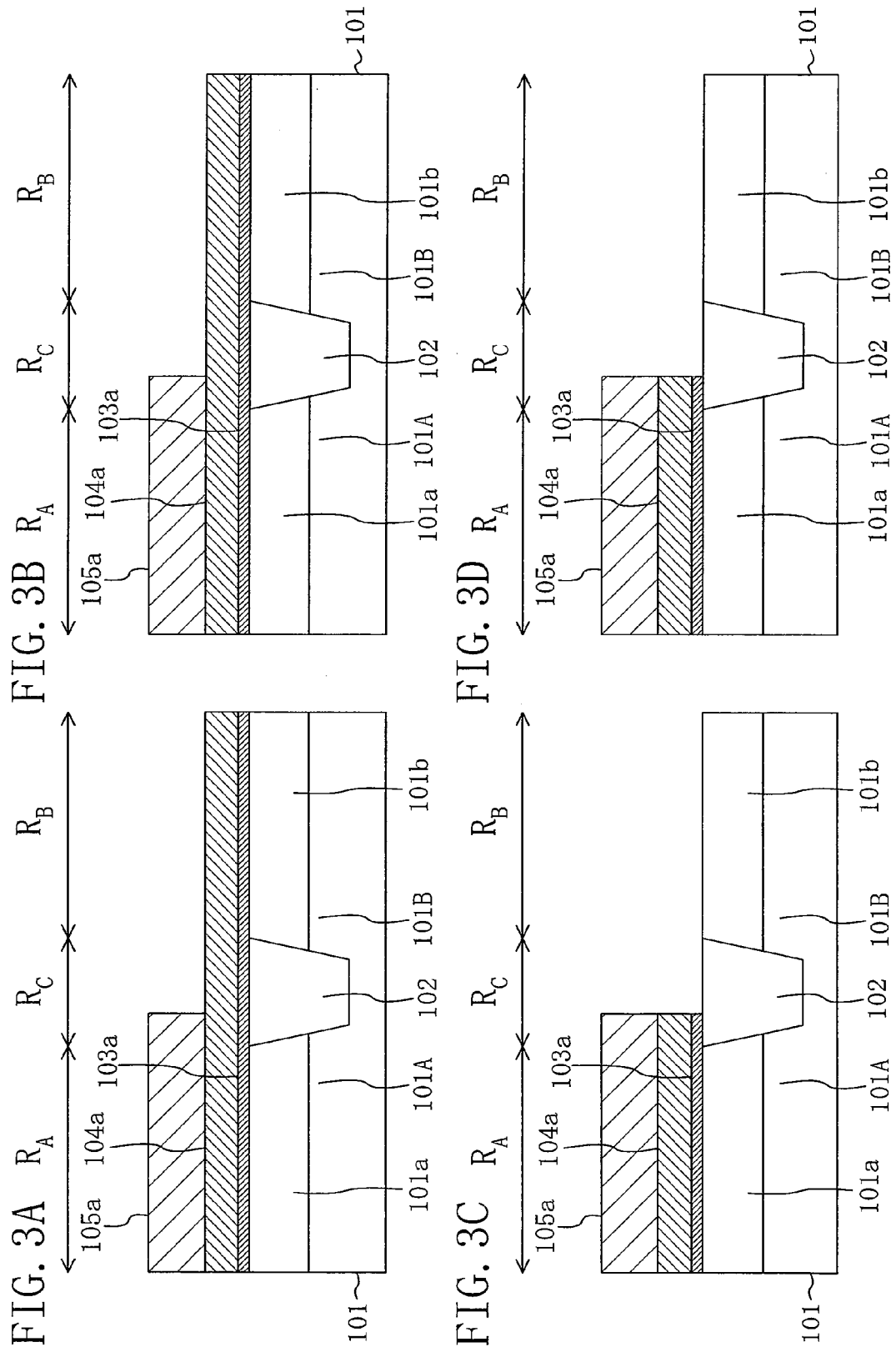

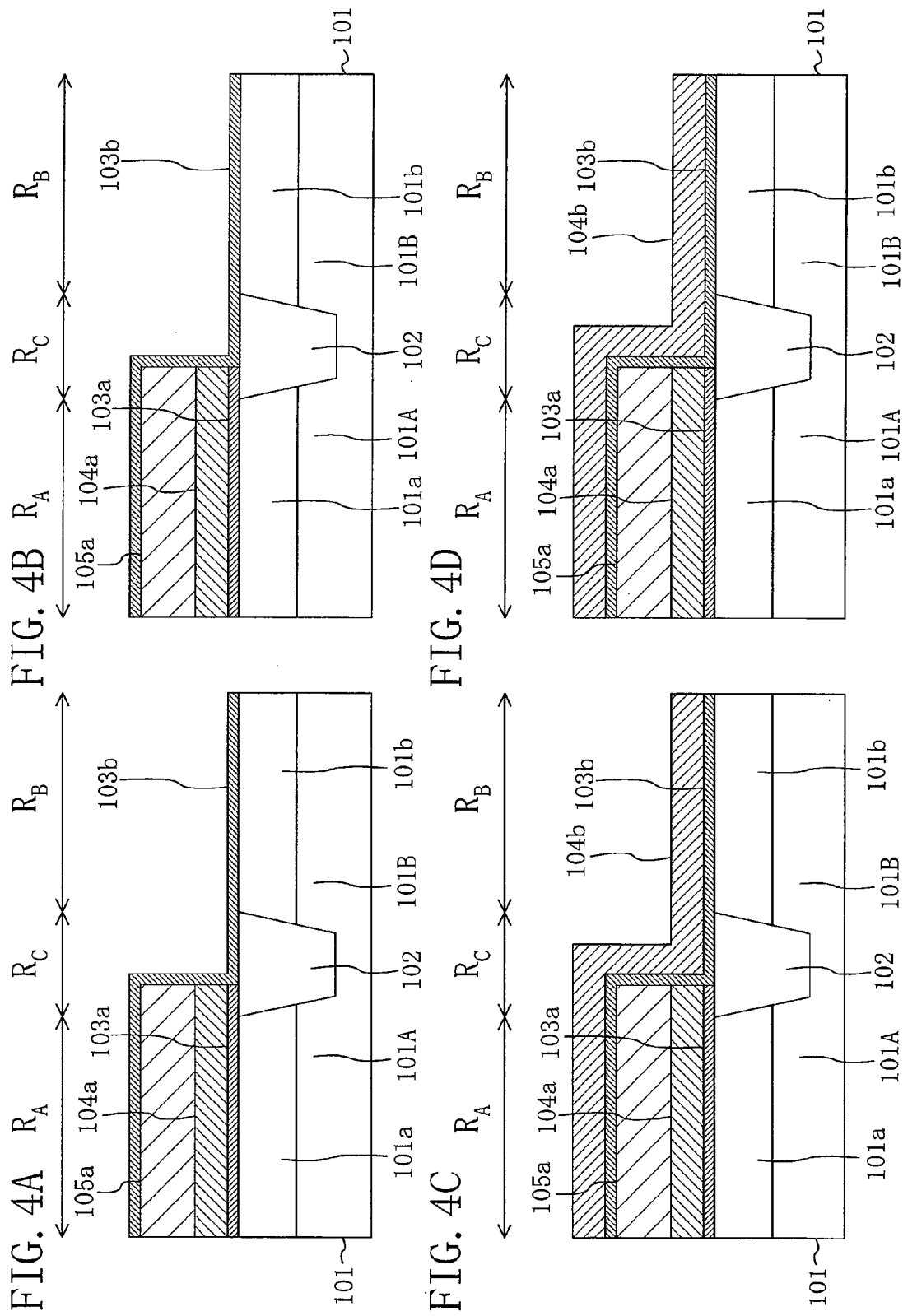

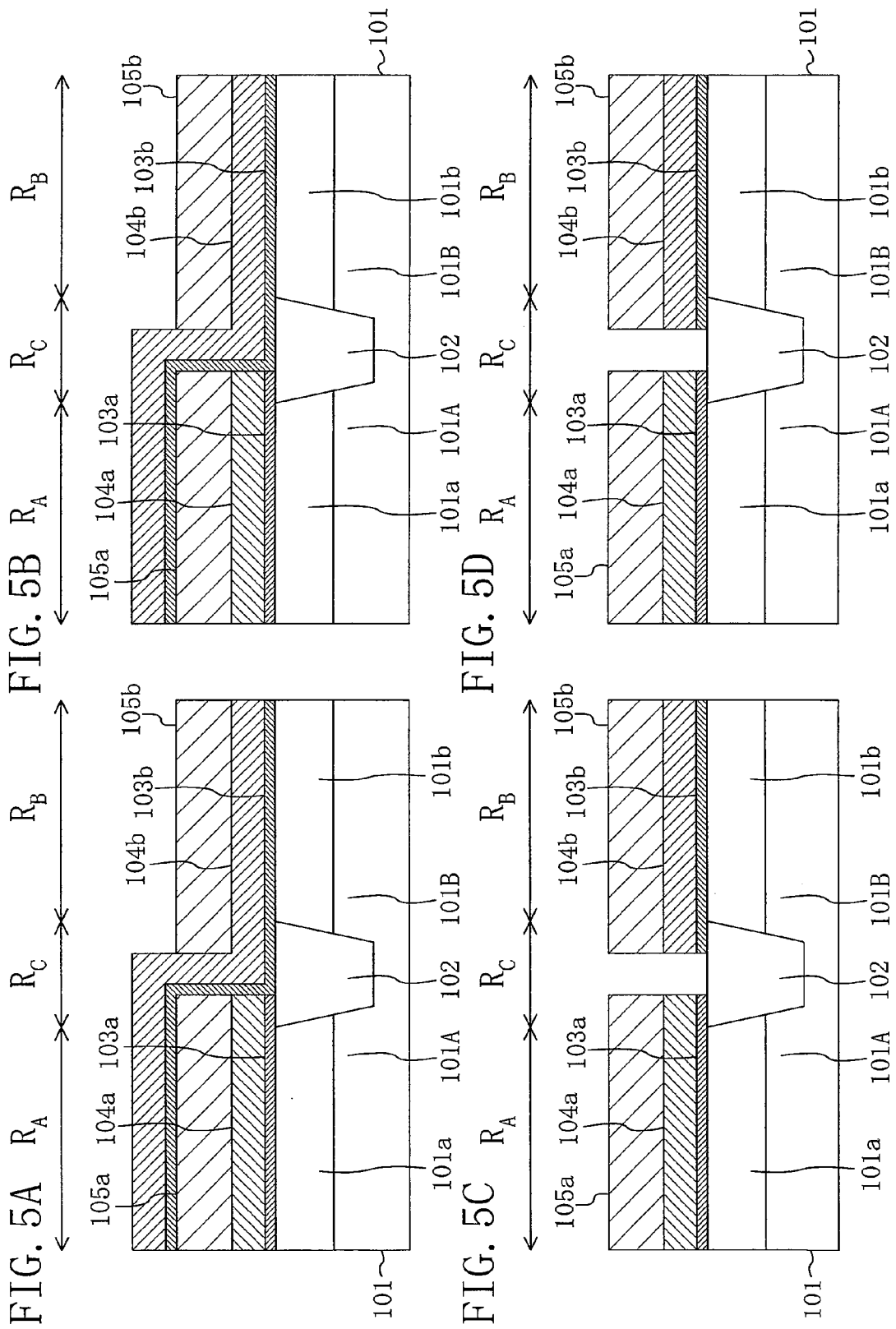

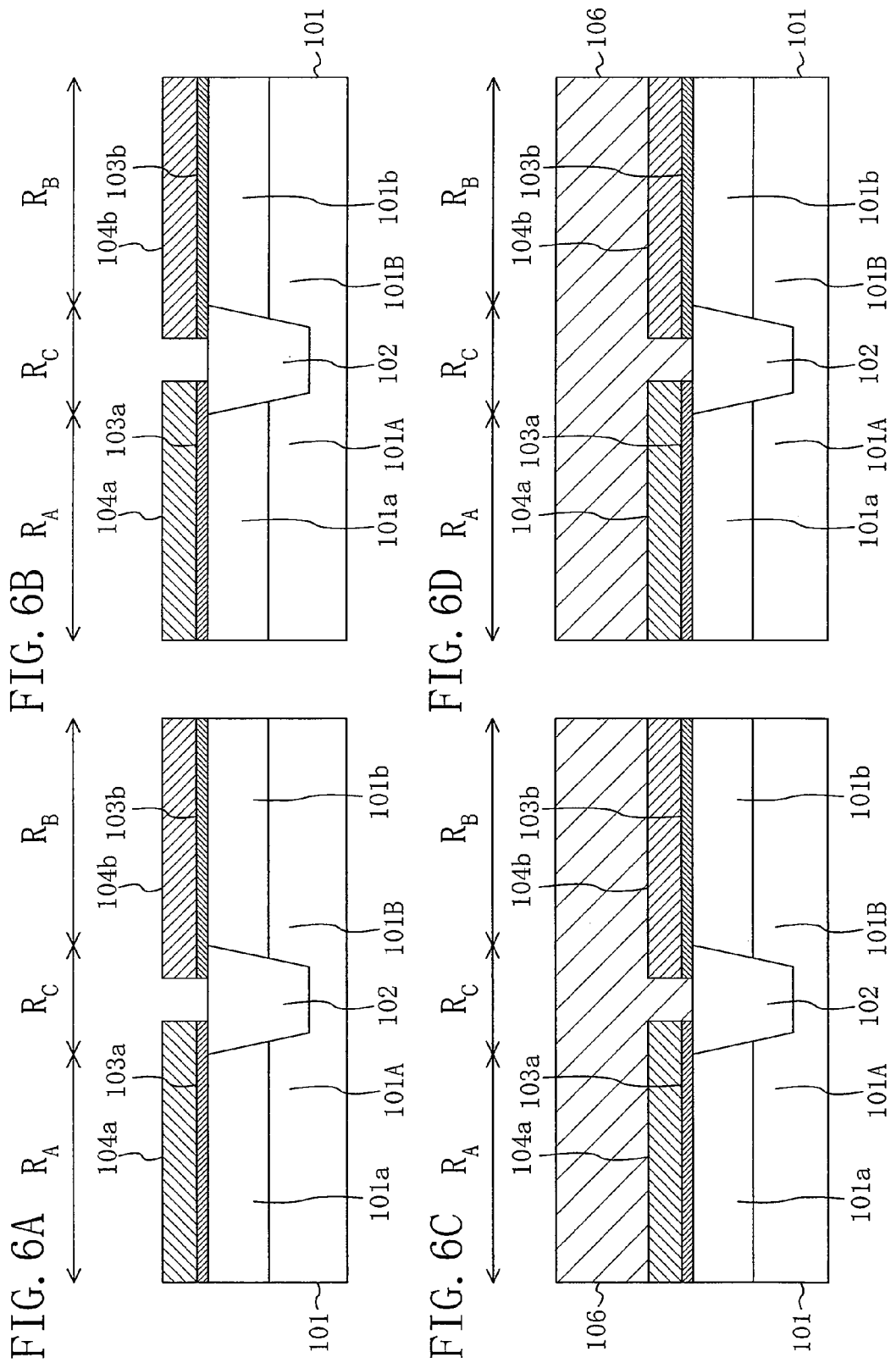

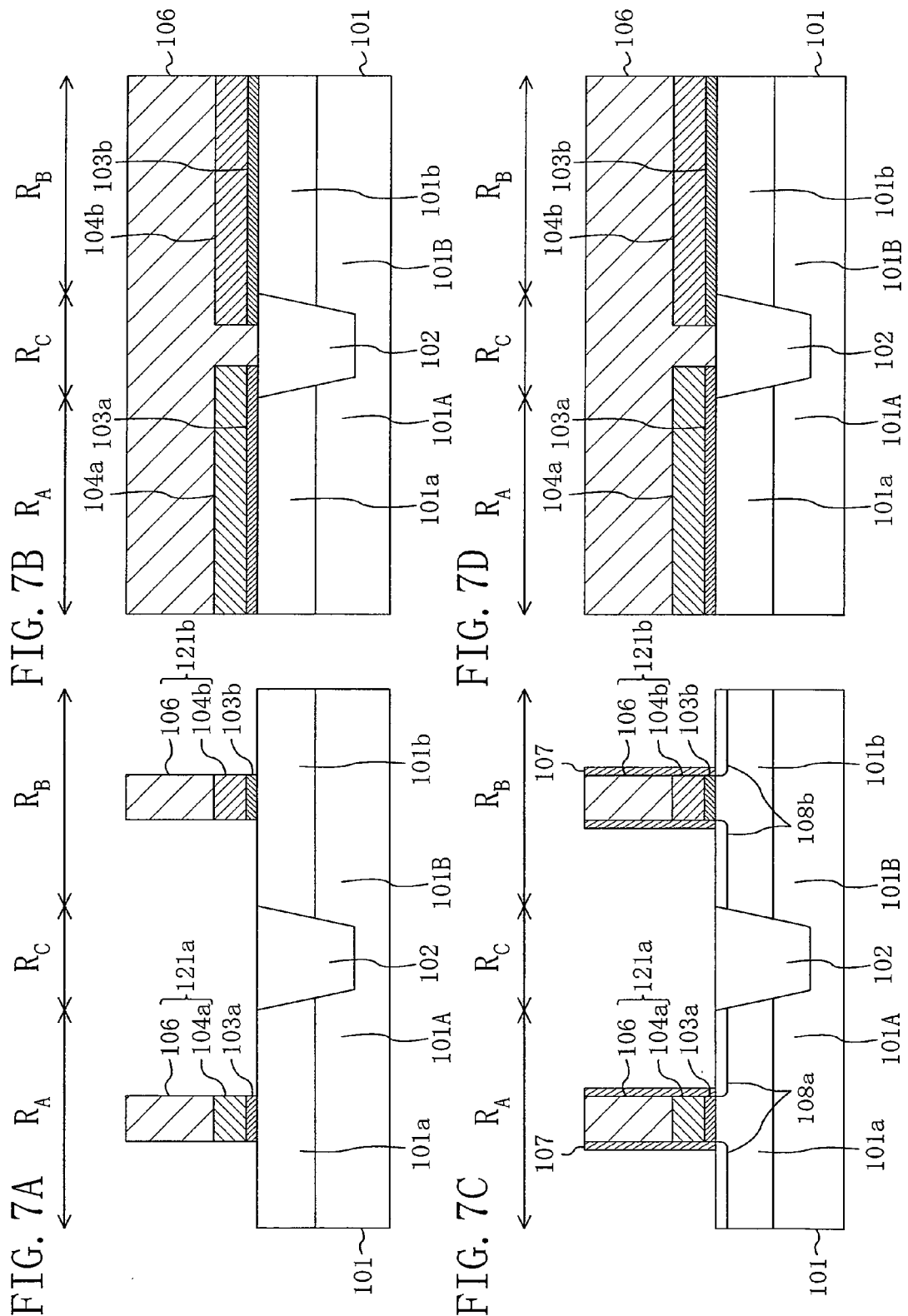

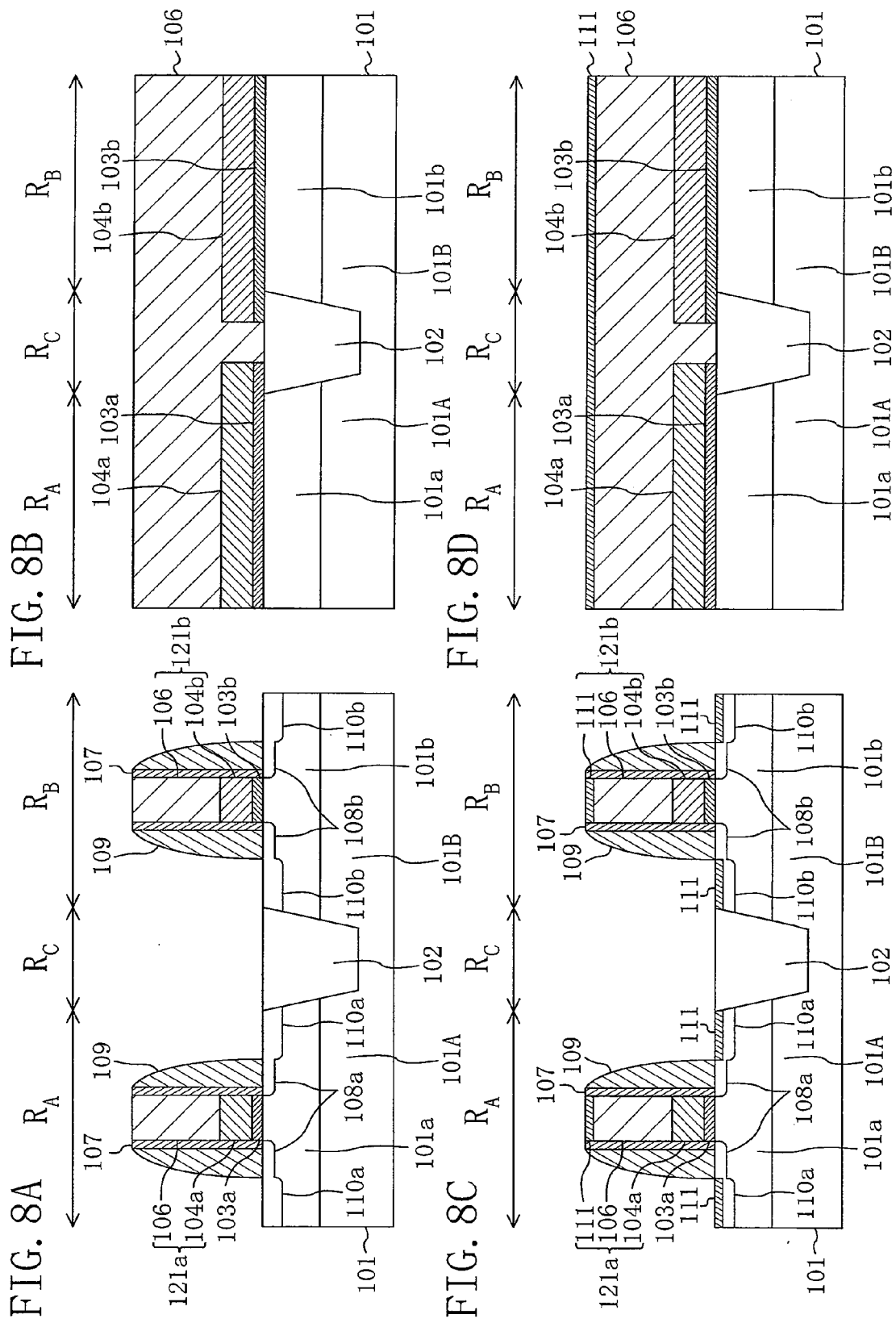

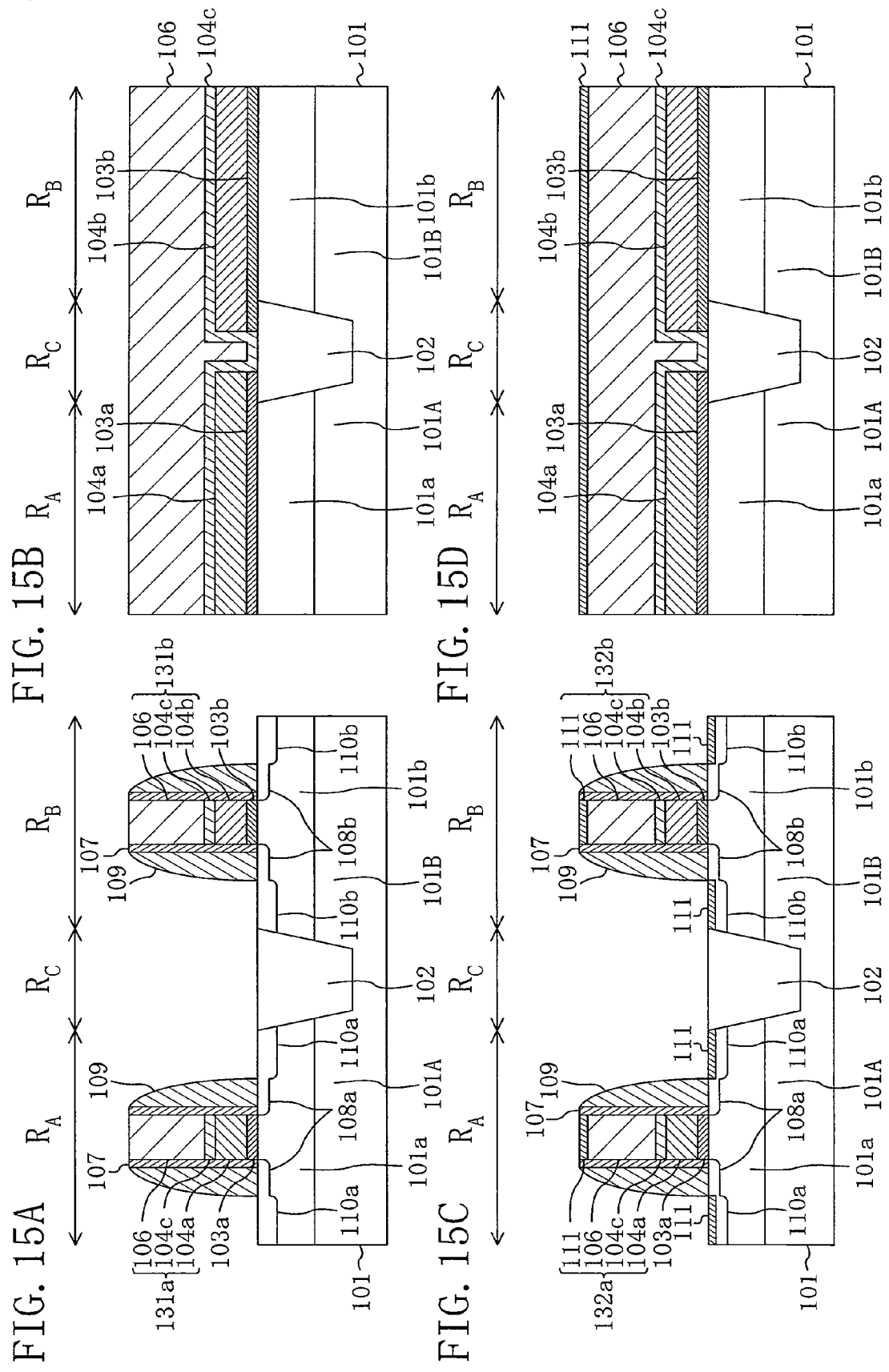

SEMICONDUCTOR DEVICE AND METHOD OF MANUFACTURING THE SAME

CROSS-REFERENCE TO RELATED APPLICATION

This is a continuation of PCT International Application PCT/JP2009/000184 filed on Jan. 20, 2009, which claims priority to Japanese Patent Application No. 2008-066543 filed on Mar. 14, 2008. The disclosures of these applications including the specifications, the drawings, and the claims are hereby incorporated by reference in its entirety.

BACKGROUND

The present disclosure relates to semiconductor devices and methods of manufacturing the devices, and more particularly to an effective technology for manufacturing semiconductors aimed at preventing an increase in resistance of an interconnection caused by disconnection at a PN boundary of a metal silicide layer in a Dual Metal Gate (DMG) process with a Metal inserted Poly-Si Stack (MIPS) structure, without sacrificing high integration of the devices due to an increase in the width of an interconnection of a gate electrode or the like.

In recent years, with high integration and minimization of semiconductor devices, minimized transistors have been rapidly developed. Accordingly, thicknesses of gate insulating films of transistors have decreased. However, a decrease in the thickness of a conventional gate insulating film of $SiO_2$ or SiON causes a non-negligible increase in the value of a gate leakage current. As such, the use of a high dielectric constant film (hereinafter referred to as a High-k film) as a gate insulating film has been considered. When a High-k film having a high dielectric constant is used as a gate insulating film, a large actual physical film thickness can be secured to prevent a tunnel current, and an equivalent oxide thickness (EOT) can be reduced to enhance driving force of the transistor and to lower the power consumption.

With respect to a gate electrode, with minimization of a transistor, depletion of an electrode causes a decrease in capacitance. The decrease in the capacitance is equivalent to a 0.4 nm increase in the film thickness in terms of the thickness of a silicon dioxide film, when polysilicon is used as the material of a gate electrode as conventionally done. This value is large and not negligible compared to the thickness of a gate insulating film, which is expected to be reduced. The use of metal for a gate electrode has been considered, instead of polysilicon used conventionally. With the use of a metal gate electrode, the above-described gate depletion can be prevented. However, in order to apply a metal gate electrode to a High-k gate insulating film, an appropriate metal material needs to be selected for each of an N-type metal-insulator-semiconductor (MIS) transistor (hereinafter referred to as "NMIS transistor" or "NMIS") and a P-type MIS transistor (hereinafter referred to as "PMIS transistor" or "PMIS").

Metal gate processes can be divided into two major types: a gate-first process, and a gate-last process. In the gate-first process, after forming a gate electrode, the step of forming a transistor is performed, which includes ion implantation and heat treatment. On the other hand, in the gate-last process, after forming a transistor using a dummy gate, the dummy gate is removed to form a gate electrode. Thus, the gate-last process is more difficult than the gate-first process. Therefore, formation of a metal gate electrode using the gate-first process is now considered. In the gate-first process, a MIPS structure is generally used in view of its processability into a gate and its consistency with a complementary metal oxide semiconductor (CMOS) process.

As described above, employing a High-k gate insulating film and a DMG having a MIPS structure has been considered as a next generation process (see, for example, S. C. Song et al. "Highly Manufacturable 45 nm LSTP CMOSFETs Using Novel Dual High-k and Dual Metal Gate CMOS Integration," VLSI Technology, Aug. 6, 2006, p. 16: hereinafter referred to as "Non-Patent Document 1").

FIG. 17 is a cross-sectional view illustrating a semiconductor device including a DMG having a MIPS structure shown in Non-Patent Document 1, and is specifically a cross-sectional view of a transistor taken in a gate width direction (W direction). As shown in FIG. 17, an isolation formation region $R_C$ in a semiconductor substrate 1 is provided with an isolation region 2 including a shallow trench isolation (STI) for segmenting a first active region 1A, which is the semiconductor substrate 1 of an NMIS formation region $R_A$, and a second active region 1B, which is the semiconductor substrate 1 of a PMIS formation region $R_B$. A P-well region 1a is formed in the first active region 1A of the NMIS formation region $R_A$ surrounded by the isolation region 2, and an N-well region 1b is formed in the second active region 1B of the PMIS formation region $R_B$ surrounded by the isolation region 2. A metal gate electrode 4a is formed on the first active region 1A with a gate insulating film 3a interposed therebetween. A metal gate electrode 4b is formed on the second active region 1B with a gate insulating film 3b interposed therebetween. A polysilicon film 6 is continuously formed on the metal gate electrodes 4a and 4b, and on the isolation region 2 located between the two electrodes. The polysilicon film 6 is processed into a form of a gate electrode, which includes an interconnection for electrically connecting the metal gate electrodes 4a and 4b. The surface of the polysilicon film 6 is silicided, thereby forming a silicide layer 7. Although not illustrated, an impurity region such as a source/drain region is formed in each of the MIS formation regions $R_A$ and $R_B$ by an ion implantation step or a heat treatment step to form a transistor structure.

SUMMARY

However, according to the DMG having the MIPS structure described in the Non-Patent Document 1, an interconnection for electrically connecting the gate electrode of a PMIS transistor and the gate electrode of an NMIS transistor is included, i.e., there exists a region, which does not contain metal, in an interconnection at a pn boundary. This causes an increase in resistance or disconnection. To be specific, the NMIS formation region includes a metal gate electrode (a metal gate electrode 4a) for an NMIS, and the PMIS formation region includes a metal gate electrode (a metal gate electrode 4b) for a PMIS. On the other hand, at the boundary of the two MIS formation regions, metal for the NMIS and metal for the PMIS are removed by respective patterning steps. As a result, as shown in FIG. 17, a current 8 flows through portions having relatively low resistance. Thus, the current flows intensively in the silicide layer 7, which is the outermost of the polysilicon film 6 in the interconnection at the pn boundary (i.e., the region which does not contain metal), to disconnect the silicide layer 7. This causes an increase in the resistance of the interconnection.

In order to solve such problems, remedies such as increasing the width of an interconnection at a pn boundary have been taken. However, this prevents high integration of a device.

In view of the foregoing, it is an object of the present disclosure to achieve high integration of a semiconductor device including a DMG having a MIPS structure while preventing disconnection or an increase in resistance of an interconnection at a pn boundary.

To achieve the above-described objective, after several studies, the present inventors conceived of continuously forming a conductive layer made of a material having lower resistance than polysilicon directly on a metal gate electrode for an NMIS and a metal gate electrode for a PMIS in a semiconductor device including a DMG having a MIPS structure.

To be specific, a semiconductor device according to the present disclosure includes a first gate electrode formed on a first active region in a semiconductor substrate, and having a first metal-containing conductive film; a second gate electrode fanned on a second active region in the semiconductor substrate, and having a second metal-containing conductive film; and an isolation region formed in the semiconductor substrate to segment the first active region and the second active region. The first metal-containing conductive film and the second metal-containing conductive film are formed on the isolation region to be spaced apart from each other. A third metal-containing conductive film, which is a part of each of the first gate electrode and the second gate electrode, is continuously formed from a top of the first metal-containing conductive film through a top of the isolation region to a top of the second metal-containing conductive film. The third metal-containing conductive film is in contact with the first metal-containing conductive film and the second metal-containing conductive film.

According to the semiconductor device of the present disclosure, the third metal-containing conductive film, which is a part of each of the gate electrodes, i.e., a conductive layer made of a material having lower resistance than polysilicon, is formed continuously and directly on the first metal-containing conductive film, which constitutes the first gate electrode, and the second metal-containing conductive film, which constitutes the second gate electrode, across the isolation region. Thus, an interconnection for electrically connecting the first gate electrode and the second gate electrode, i.e., an interconnection at a pn boundary on the isolation region contains metal (i.e., a third metal-containing conductive film). Due to this structure, the resistance of the interconnection at the pn boundary can be reduced without taking remedies such as increasing the width of the interconnection at the pn boundary. This facilitates high integration of a semiconductor device including a DMG having a MIPS structure, and prevents problems such as disconnection of a silicide caused by concentration of current on a silicide on a polysilicon surface in a conventional HIPS structure, i.e., disconnection caused by an increase in resistance of an interconnection at a PN boundary.

In the semiconductor device according to the present disclosure, the third metal-containing conductive film may be in contact with the isolation region. By this configuration, the structure of the semiconductor device according to the present disclosure can be easily obtained by forming the third metal-containing conductive film directly on the first metal-containing conductive film constituting the first gate electrode, and the second metal-containing conductive film constituting the second gate electrode to be in contact with the isolation region. In this case, the third metal-containing conductive film may be formed to fill space on the isolation region and between the first metal-containing conductive film and the second metal-containing conductive film.

In the semiconductor device according to the present disclosure, a silicon region may be interposed between the third metal-containing conductive film and the isolation region. That is, a part of silicon directly on the isolation region in the MIPS structure may not be silicided.

In the semiconductor device according to the present disclosure, the third metal-containing conductive film may be made of a silicide. As a result, the structure of the semiconductor device according to the present disclosure can be easily obtained by siliciding silicon in the MIPS structure. In this case, the silicide may include Ti, Ni, Co, or Pt.

In the semiconductor device according to the present disclosure, a silicon film, which is a part of each of the first gate electrode and the second gate electrode, may be formed on the third metal-containing conductive film. In the MIPS structure, another metal may be inserted between metal and silicon to achieve the structure of the semiconductor device according to the present disclosure. Note that the surface of the silicon film may be silicided.

The semiconductor device according to the present disclosure may further include a first high dielectric gate insulating film formed between the first active region and the first gate electrode, and a second high dielectric gate insulating film formed between the second active region and the second gate electrode. Note that, in the present application, the high dielectric gate insulating film refers to a gate insulating film having a higher dielectric constant than SiON, for example, a gate insulating film including a Hf element and a Zr element.

In the semiconductor device according to the present disclosure, where the first gate electrode is a gate electrode of an N-type MIS transistor, the first metal-containing conductive film is preferably made of a material having a work function of 4.55 eV or less, for example, a material including at least one of a Ta compound and a Hf compound.

In the semiconductor device according to the present disclosure, where the second gate electrode is a gate electrode of a P-type MIS transistor, the second metal-containing conductive film is preferably made of a material having a work function of 4.65 eV or more, for example, a material including at least one of a Ti compound and a Ru compound.

A method of manufacturing a semiconductor device according to the present disclosure includes forming an isolation region in a semiconductor substrate to segment a first active region and a second active region in the semiconductor substrate; forming on the first active region, a first metal-containing conductive film which is a part of a first gate electrode; forming on the second active region, a second metal-containing conductive film which is a part of a second gate electrode; and continuously forming from a top of the first metal-containing conductive film through a top of the isolation region to a top of the second metal-containing conductive film, a third metal-containing conductive film which is a part of each of the first gate electrode and the second gate electrode to be in contact with the first metal-containing conductive film and the second metal-containing conductive film. In the forming of the third metal-containing conductive film, the first metal-containing conductive film and the second metal-containing conductive film are formed on the isolation region apart from each other.

According to the method of manufacturing the semiconductor device of the present disclosure, the third metal-containing conductive film, which is a part of each of the gate electrodes, i.e., a conductive layer made of a material having lower resistance than polysilicon, is formed continuously and directly on the first metal-containing conductive film, which constitutes the first gate electrode, and the second metal-containing conductive film, which constitutes the second gate electrode, across the isolation region. Thus, an interconnection for electrically connecting the first gate electrode and the second gate electrode, i.e., an interconnection at a pn boundary on the isolation region contains metal (i.e., a third metal-containing conductive film). This reduces the resistance of the interconnection at the pn boundary without taking remedies such as increasing the width of the interconnection at the pn boundary. This facilitates high integration of a semiconductor device including a DMG having a MIPS structure, and prevents problems such as disconnection of a silicide caused by concentration of current on the silicide on a polysilicon surface in a conventional MIPS structure, i.e., disconnection caused by an increase in resistance of an interconnection at a PN boundary.

In the method of manufacturing the semiconductor device according to the present disclosure, the forming of the first metal-containing conductive film may include, after forming the first metal-containing conductive film on the semiconductor substrate, selectively removing the first metal-containing conductive film on the second active region. The forming of the second metal-containing conductive film may include, after forming the second metal-containing conductive film on the semiconductor substrate, selectively removing the second metal-containing conductive film on the first active region. This prevents deterioration of the gate insulating films when patterning the metal-containing conductive films.

In the method of manufacturing the semiconductor device according to the present disclosure, the forming of the third metal-containing conductive film may include forming the third metal-containing conductive film to be in contact with the isolation region. By this configuration, the structure of the semiconductor device according to the present disclosure can be easily obtained by forming the third metal-containing conductive film directly on the first metal-containing conductive film constituting the first gate electrode, and the second metal-containing conductive film constituting the second gate electrode to be in contact with the isolation region. In this case, the forming of the third metal-containing conductive film may include forming the third metal-containing conductive film to fill space on the isolation region and between the first metal-containing conductive film and the second metal-containing conductive film.

In the method of manufacturing the semiconductor device according to the present disclosure, the forming of the third metal-containing conductive film may include, after forming a silicon film on the first metal-containing conductive film, the isolation region, and the second metal-containing conductive film, patterning the first metal-containing conductive film, the second metal-containing conductive film, and the silicon film to form the first gate electrode and the second gate electrode, and siliciding the patterned silicon film to form the third metal-containing conductive film. As a result, the structure of the semiconductor device according to the present disclosure can be easily obtained by siliciding silicon in the MIPS structure. In this case, the forming of the third metal-containing conductive film may include retaining a part of the silicon region between the third metal-containing conductive film and the isolation region. In other words, a part of silicon directly on the isolation region in the MIPS structure may not be silicided.

The method of manufacturing the semiconductor device according to the present disclosure may further include, after the forming of the third metal-containing conductive film, forming on the third metal-containing conductive film, a silicon film which is a part of each of the first gate electrode and the second gate electrode. In the MIPS structure, another metal may be inserted between metal and silicon to achieve the structure of the semiconductor device according to the present disclosure. The method may further include, after the forming of the silicon film, patterning the first metal-containing conductive film, the second metal-containing conductive film, the third metal-containing conductive film, and the silicon film to form the first gate electrode and the second gate electrode, and then siliciding a surface of the patterned silicon film.

According to the present disclosure, since the interconnection at the pn boundary for electrically connecting the first gate electrode and the second gate electrode contains metal, the resistance of the interconnection at the pn boundary can be reduced without taking remedies such as increasing the width of the interconnection at the pn boundary. This facilitates high integration of a semiconductor device including a DMG having a MIPS structure and prevents problems such as disconnection caused by an increase in resistance of an interconnection at a PN boundary.

As described above, the present disclosure relates to a semiconductor device and a method of manufacturing the device. In particular, when applied to a DMG process with a MIPS structure, the present disclosure prevents problems such as disconnection caused by an increase in resistance of an interconnection at a PN boundary, and is therefore useful.

BRIEF DESCRIPTION OF THE DRAWINGS

FIG. 1A is a cross-sectional view taken in a gate length direction (L direction), and FIG. 1B is a cross-sectional view taken in a gate width direction (W direction).

FIGS. 2A-2D are cross-sectional views illustrating steps in a method of manufacturing the semiconductor device according to the first embodiment of the present disclosure. FIGS. 2A and 2C are cross-sectional views taken in the L direction, and FIGS. 2B and 2D are cross-sectional views taken in the W direction.

FIGS. 3A-3D are cross-sectional views illustrating steps in the method of manufacturing the semiconductor device according to the first embodiment of the present disclosure. FIGS. 3A and 3C are cross-sectional views taken in the L direction, and FIGS. 3B and 3D are cross-sectional views taken in the W direction.

FIGS. 4A-4D are cross-sectional views illustrating steps in the method of manufacturing the semiconductor device according to the first embodiment of the present disclosure. FIGS. 4A and 4C are cross-sectional views taken in the L direction, and FIGS. 4B and 4D are cross-sectional views taken in the W direction.

FIGS. 5A-5D are cross-sectional views illustrating steps in the method of manufacturing the semiconductor device according to the first embodiment of the present disclosure. FIGS. 5A and 5C are cross-sectional views taken in the L direction, and FIGS. 5B and 5D are cross-sectional views taken in the W direction.

FIGS. 6A-6D are cross-sectional views illustrating steps in the method of manufacturing the semiconductor device according to the first embodiment of the present disclosure. FIGS. 6A and 6C are cross-sectional views taken in the L direction, and FIGS. 6B and 6D are cross-sectional views taken in the W direction.

FIGS. 7A-7D are cross-sectional views illustrating steps in the method of manufacturing the semiconductor device according to the first embodiment of the present disclosure.

FIGS. 7A and 7C are cross-sectional views taken in the L direction, and FIGS. 7B and 7D are cross-sectional views taken in the W direction.

FIGS. 8A-8D are cross-sectional views illustrating steps in the method of manufacturing the semiconductor device according to the first embodiment of the present disclosure. FIGS. 8A and 8C are cross-sectional views taken in the L direction, and FIGS. 8B and 8D are cross-sectional views taken in the W direction.

FIG. 9A is a cross-sectional view taken in the L direction, and FIG. 9B is a cross-sectional view taken in the W direction.

FIG. 10A is a cross-sectional view taken in the L direction, and FIG. 10B is a cross-sectional view taken in the W direction.

FIG. 12A is a cross-sectional view taken in the L direction, and FIG. 12B is a cross-sectional view taken in the W direction.

FIGS. 13A and 13C are cross-sectional views taken in the L direction, and FIGS. 13B and 13D are cross-sectional views taken in the W direction.

FIGS. 14A and 14C are cross-sectional views taken in the L direction, and FIGS. 14B and 14D are cross-sectional views taken in the W direction.

FIGS. 15A-15D are cross-sectional views illustrating steps in the method of manufacturing the semiconductor device according to the second embodiment of the present disclosure. FIGS. 15A and 15C are cross-sectional views taken in the L direction, and FIGS. 15B and 15D are cross-sectional views taken in the W direction.

DETAILED DESCRIPTION

First Embodiment

A semiconductor device and a method of manufacturing the device according to a first embodiment of the present disclosure will be described hereinafter with reference to the drawings.

Figure 1B:
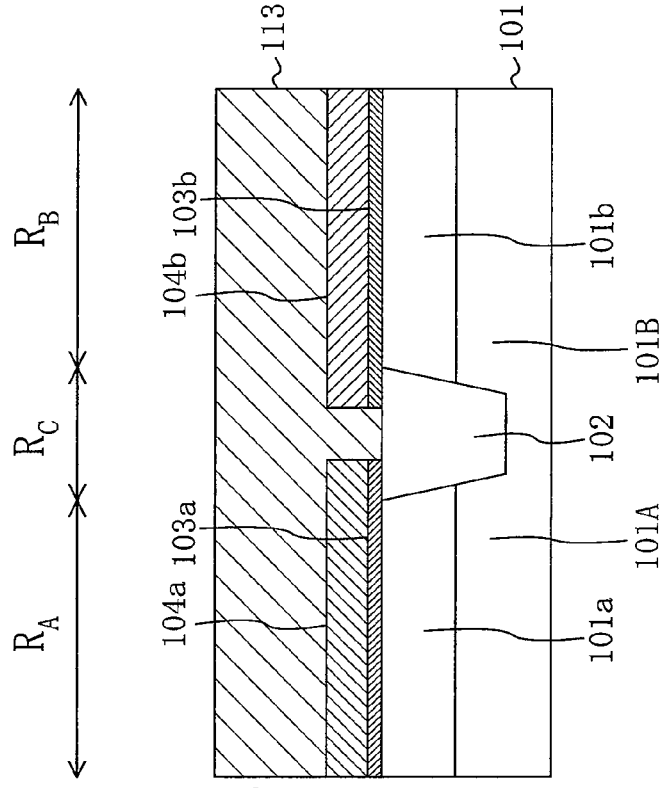
FIGS. 1A and 1B illustrate a cross-sectional structure of a semiconductor device according to a first embodiment of the present disclosure.
Figure 1A:
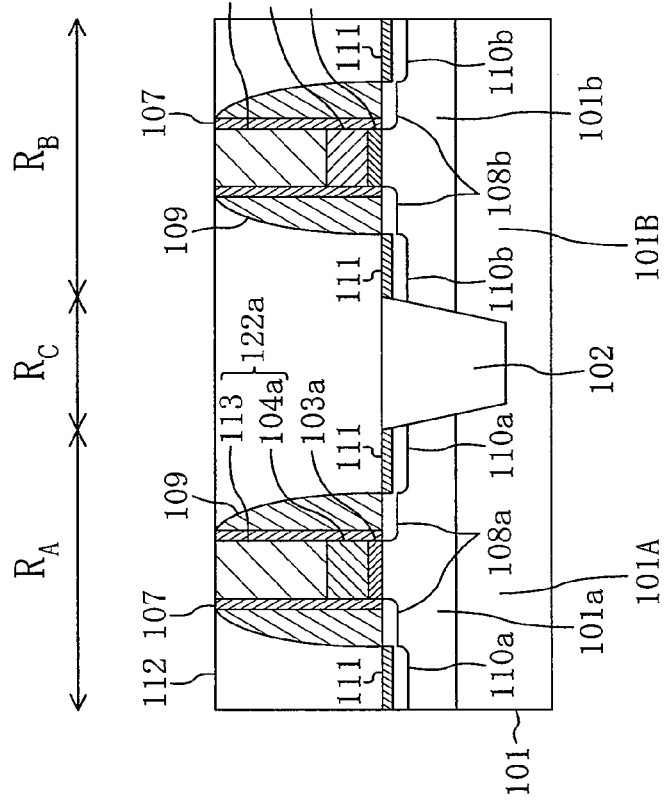

FIGS. 1A and 1B illustrate a cross-sectional structure of the semiconductor device according to the first embodiment of the present disclosure. FIG. 1A is a cross-sectional view taken in a gate length direction (L direction), and FIG. 1B is a cross-sectional view taken in a gate width direction (W direction). In the drawings, "$R_A$" on the left side denotes an NMIS formation region, in which an NMIS transistor is formed; "$R_B$" on the left side denotes a PMIS formation region, in which a PMIS transistor is formed; and "$R_C$" in the center denotes an isolation formation region, in which an isolation region is formed.

As shown in FIGS. 1A and 1B, the isolation formation region $R_C$ of a semiconductor substrate 101 is provided with an isolation region 102 including an STI for segmenting a first active region 101A, which is the semiconductor substrate 101 of the NMIS formation region $R_A$, and a second active region 101B, which is the semiconductor substrate 101 of the PMIS formation region $R_B$. A P-well region 101a is formed in the first active region 101A of the NMIS formation region $R_A$ surrounded by the isolation region 102, and an N-well region 101b is formed in the second active region 101B of the PMIS formation region $R_B$ surrounded by the isolation region 102. A first gate electrode 122a is formed on the first active region 101A with a first gate insulating film 103a interposed therebetween, and a second gate electrode 122b is formed on the second active region 101B with a second gate insulating film 103b interposed therebetween. The gate insulating films 103a and 103b are, for example, HfSiO films which are High-k films. The first gate electrode 122a of the NMIS transistor includes a first metal-containing conductive film 104a formed on the first gate insulating film 103a, and a third metal-containing conductive film 113 formed on the first metal-containing conductive film 104a. The second gate electrode 122b of the PMIS transistor includes a second metal-containing conductive film 104b formed on the second gate insulating film 103b, and the third metal-containing conductive film 113 formed on the second metal-containing conductive film 104b. The first metal-containing conductive film 104a is made of, for example, a material including at least one of a Ta compound and a Hf compound. The second metal-containing conductive film 104b is made of, for example, a material including at least one of a Ti compound and a Ru compound. The third metal-containing conductive film 113 is made of, for example, a silicide including Ti, Ni, Co, or Pt.

Furthermore, as shown in FIGS. 1A and 1B, an insulating sidewall spacer 109 is formed on each side surface of the gate electrodes 122a and 122b with an insulating offset spacer 107 interposed therebetween. An N-type extension region (a shallow N-type source/drain region) 108a is formed under the insulating sidewall spacer 109 in the surface portion of the first active region 101A, and an N-type source/drain region (a deep N-type source/drain region) 110a is formed outside the N-type extension region 108a. A P-type extension region (a shallow P-type source/drain region) 108b is formed under the insulating sidewall spacer 109 in the surface portion of the second active region 101B, and a P-type source/drain region (a deep P-type source/drain region) 110b is formed outside the P-type extension region 108b. A silicide layer 111 is formed in the surface portions of the source/drain regions 110a and 110b. An interlayer insulating film 112 is formed over the entire surface of the semiconductor substrate 101 to bury the gate electrodes 122a and 122b except for the upper surfaces of the gate electrodes 122a and 122b.

While in this embodiment shown in FIG. 1A, the upper surfaces of the gate electrodes 122a and 122b have the same height as an upper surface of the interlayer insulating film 112, the upper surfaces need not necessarily have a same height. For example, the upper surfaces of the gate electrodes 122a and 122b may be higher than the upper surface of the interlayer insulating film 112.

One of the features of this embodiment is that the third metal-containing conductive film 113, which is a part of each of the gate electrodes 122a and 122b, is continuously formed from a top of the first metal-containing conductive film 104a through a top of the isolation region 102 to a top of the second metal-containing conductive film 104b to be in contact with the first metal-containing conductive film 104a and the second metal-containing conductive film 104b.

In this embodiment, as shown in FIG. 1B, in the W direction, the first metal-containing conductive film 104a constituting the first gate electrode 122a is formed over the first active region 101A and the adjacent edge of the isolation region 102, and the second metal-containing conductive film 104b constituting the second gate electrode 122b is formed over the second active region 101B and the adjacent edge of the isolation region 102. That is, in the W direction, the first metal-containing conductive film 104a and the second metal-containing conductive film 104b are divided on the isolation region 102 located between the first active region 101A and the second active region 101B. In this embodiment, the third metal-containing conductive film 113 is formed to fill space on the isolation region 102 and between the first metal-containing conductive film 104a and the second metal-containing conductive film 104b, i.e., to be in contact with the isolation region 102.

A method of manufacturing the semiconductor device in this embodiment shown in FIGS. 1A and 1B will be described below. FIGS. 2A-2D, 3A-3D, 4A-4D, 5A-5D, 6A-6D, 7A-7D, 8A-8D, 9A, 9B, 10A and 10B are cross-sectional views illustrating steps in the method of manufacturing the semiconductor device according to the first embodiment of the present disclosure. FIGS. 2A, 2C, 3A, 3C, 4A, 4C, 5A, 5C, 6A, 6C, 7A, 7C, 8A, 8C, 9A and 10A are cross-sectional views taken in the L direction. FIGS. 2B, 2D, 3B, 3D, 4B, 4D, 5B, 5D, 6B, 6D, 7B, 7D, 8B, 8D, 9B and 10B are cross-sectional views taken in the W direction.

First, as shown in FIGS. 2A and 2B, an isolation formation region $R_C$ of a semiconductor substrate 101 is provided with an isolation region 102 including an STI for segmenting a first active region 101A, which is the semiconductor substrate 101 of the NMIS formation region $R_A$, and a second active region 101B, which is the semiconductor substrate 101 of a PMIS formation region $R_B$. Next, a P-well region 101a is formed in the first active region 101A of the NMIS formation region $R_A$ surrounded by the isolation region 102, and an N-well region 101b is formed in the second active region 101B of the PMIS formation region $R_B$ surrounded by the isolation region 102. Then, a film such as a HfSiO film, which is a High-k film, is formed over the entire surface of the semiconductor substrate 101 as a first gate insulating film 103a for the NMIS transistor by chemical vapor deposition (CVD).

Then, as shown in FIGS. 2C and 2D, a first metal-containing conductive film 104a; which is, for example, made of a material including at least one of a Ta compound and a Hf compound, and has a thickness of about 20 nm; is formed on the first gate insulating film 103a as a metal gate electrode for the NMIS transistor.

Next, as shown in FIGS. 3A and 3B, in order to remove the part of the first gate insulating film 103a for the NMIS transistor and the part of the first metal-containing conductive film 104a for the NMIS transistor, which are deposited in the PMIS formation region $R_B$, a hard mask 105a with a thickness of about 40 nm is formed on the first metal-containing conductive film 104a. The hard mask 105a covers the first active region 101A and the adjacent edge of the isolation region 102, and is open in the PMIS formation region $R_B$. The hard mask 105a is preferably made of a material such as a Si material, which does not oxidize a metal material.

Then, as shown in FIGS. 3C and 3D, the first gate insulating film 103a and the first metal-containing conductive film 104a in the PMIS formation region $R_B$ are removed by wet etching or dry etching using the hard mask 105a. At this time, etching is carried out so that the first gate insulating film 103a and the first metal-containing conductive film 104a remain not only on the first active region 101A but also on the adjacent edge of the isolation region 102. When using dry etching, the first gate insulating film 103a and the first metal-containing conductive film 104a may be etched continuously by changing the etching condition such as the etchant in the same chamber.

Next, as shown in FIGS. 4A and 4B, a film such as a HfSiO film, which is a High-k film, is formed by CVD over the entire surface of the semiconductor substrate 101 as a second gate insulating film 103b for a PMIS transistor.

Then, as shown in FIGS. 4C and 4D, a second metal-containing conductive film 104b, which is made of, for example, a material including at least one of a Ti compound and a Ru compound, and has a thickness of about 20 nm, is formed on the second gate insulating film 103b as a metal gate electrode for the PMIS transistor.

Next, as shown in FIGS. 5A and 5B, in order to remove the part of the second gate insulating film 103b for the PMIS transistor and the part of the second metal-containing conductive film 104b for the PMIS transistor, which are deposited in the NMIS formation region $R_A$, a hard mask 105b with a thickness of about 40 nm is formed on the second metal-containing conductive film 104b. The hard mask 105b covers the second active region 101B and the adjacent edge of the isolation region 102, and is open in the NMIS formation region $R_A$. The hard mask 105b is preferably made of a material such as a Si material, which does not oxidize a metal material.

Then, as shown in FIGS. 5C and 5D, the second gate insulating film 103b and the second metal-containing conductive film 104b in the NMIS formation region $R_A$ are removed by wet etching or dry etching using the hard mask 105b. At this time, the hard mask 105a functions as an etching stopper in the NMIS formation region $R_A$. Etching is carried out so that the second gate insulating film 103b and the second metal-containing conductive film 104b remain not only on the second active region 101B but also on the adjacent edge of the isolation region 102. As a result, the first metal-containing conductive film 104a and the second metal-containing conductive film 104b are spaced apart from each other by at least a predetermined distance (i.e., the total thickness of the second gate insulating film 103b and the second metal-containing conductive film 104b) on the isolation region 102 located between the first active region 101A and the second active region 101B. When using dry etching, the second gate insulating film 103b and the second metal-containing conductive film 104b may be etched continuously by changing the etching condition such as the etchant in the same chamber.

In the steps shown in FIGS. 3C and 3D, the first gate insulating film 103a in the PMIS formation region $R_B$ can be used as a gate insulating film for a PMIS transistor without being removed. In this case, when the second metal-containing conductive film 104b is formed in the steps shown in FIGS. 4C and 4D, the first gate insulating film 103a remaining in the PMIS formation region $R_B$ is inevitably deteriorated. Therefore, in this embodiment, not only the metal gate electrodes but also the gate insulating films are formed separately for respective transistors.

Then, as shown in FIGS. 6A and 6B, after removing the hard masks 105a and 105b, a polysilicon film 106 with a thickness of, for example, 100 nm is formed over the entire surface of the semiconductor substrate 101, as shown in FIGS. 6C and 6D.

Next, as shown in FIGS. 7A and 7B, the polysilicon film 106 of the NMIS formation region $R_A$, the first metal-containing conductive film 104a of the NMIS formation region $R_A$, the polysilicon film 106 of the PMIS formation region $R_B$, and the second metal-containing conductive film 104b of the PMIS formation region $R_B$ are patterned by dry etching. As a result, a first gate portion 121a including the first metal-containing conductive film 104a and the polysilicon film 106 is formed on the first active region 101A with the first gate insulating film 103a interposed therebetween. A second gate portion 121b including the second metal-containing conductive film 104b and the polysilicon film 106 is formed on the second active region 101B with the second gate insulating film 103b interposed therebetween. At this time, as shown in FIG. 7B, the polysilicon film 106 of the first gate portion 121a and the polysilicon film 106 of the second gate portion 121b are formed integrally with the polysilicon film 106 on the isolation region 102 interposed therebetween. Furthermore, in the steps shown in FIGS. 7A and 7B, the first gate insulating film 103a formed outside the first gate portion 121a and the second gate insulating film 103b formed outside the second gate portion 121b are removed. In this embodiment, the materials of the metal-containing conductive films 104a and 104b, and the etching condition are selected appropriately. This enables continuous etching of the polysilicon film 106, and the metal-containing conductive films 104a and 104b in the same chamber, thereby forming the gate portions 121a and 121b by patterning at the same time.

Then, as shown in FIGS. 7C and 7D, after forming an insulating offset spacer 107 on each side surface of the gate portions 121a and 121b, the first active region 101A and the second active region 101B are ion-implanted using the gate portions 121a and 121b, and the insulating offset spacers 107 as masks, thereby forming an N-type extension region (a shallow N-type source/drain region) 108a and a P-type extension region (a shallow P-type source/drain region) 108b.

Next, as shown in FIGS. 8A and 8B, after forming an insulating sidewall spacer 109 on each side surface of the gate portions 121a and 121b with the insulating offset spacer 107 interposed therebetween, the first active region 101A and the second active region 101B are ion-implanted using the gate portions 121a and 121b, the insulating offset spacer 107, and the insulating sidewall spacer 109 as masks, thereby forming an N-type source/drain region (a deep N-type source/drain region) 110a and a P-type source/drain region (a deep P-type source/drain region) 110b.

Then, as shown in FIGS. 8C and 8D, the surface portion of the polysilicon film 106 constituting the gate portions 121a and 121b, and the surface portions of the source/drain regions 110a and 110b are silicided to form a silicide layer 111. This reduces the resistance of the source/drain regions 110a and 110b. In this embodiment, the silicide layer 111 is not necessarily formed on the surface portion of the polysilicon film 106 constituting the gate portions 121a and 121b.

Figure 9B:
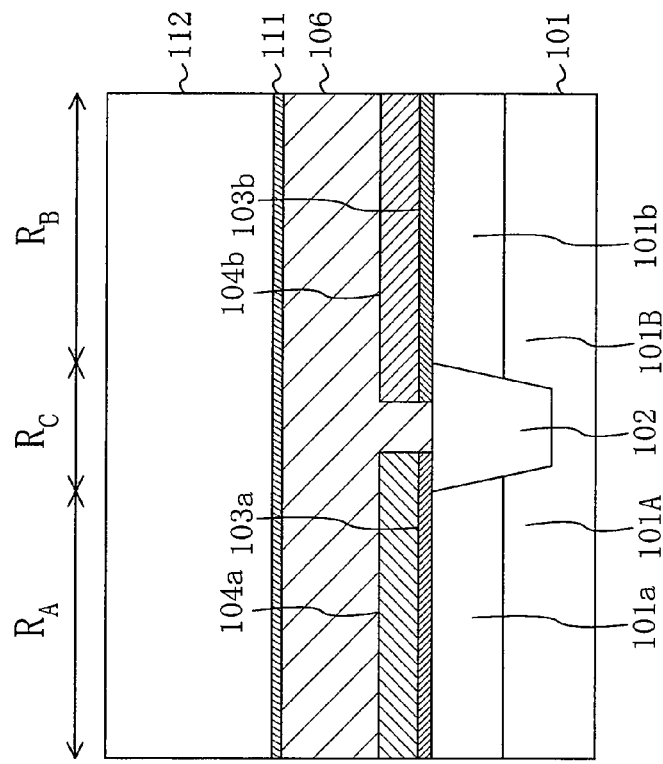
FIGS. 9A and 9B are cross-sectional views illustrating steps in the method of manufacturing the semiconductor device according to the first embodiment of the present disclosure.
Figure 9A:
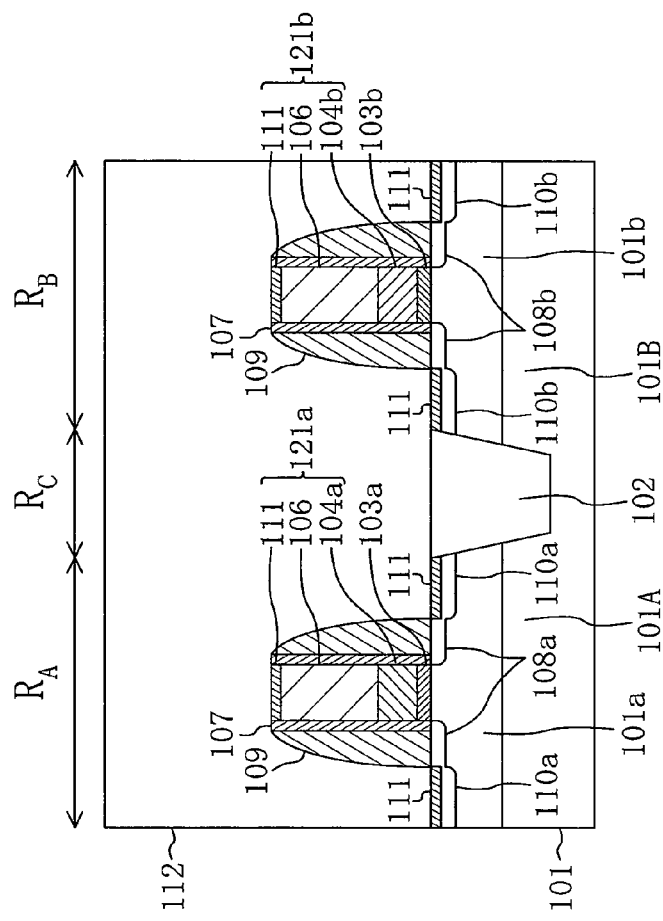
Figure 10A:
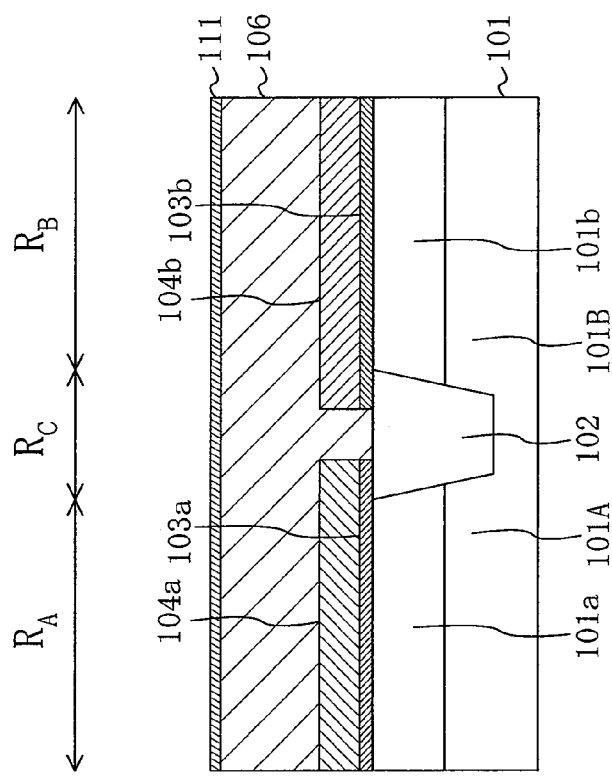
FIGS. 10A and 10B are cross-sectional views illustrating steps in the method of manufacturing the semiconductor device according to the first embodiment of the present disclosure.
Figure 10B:
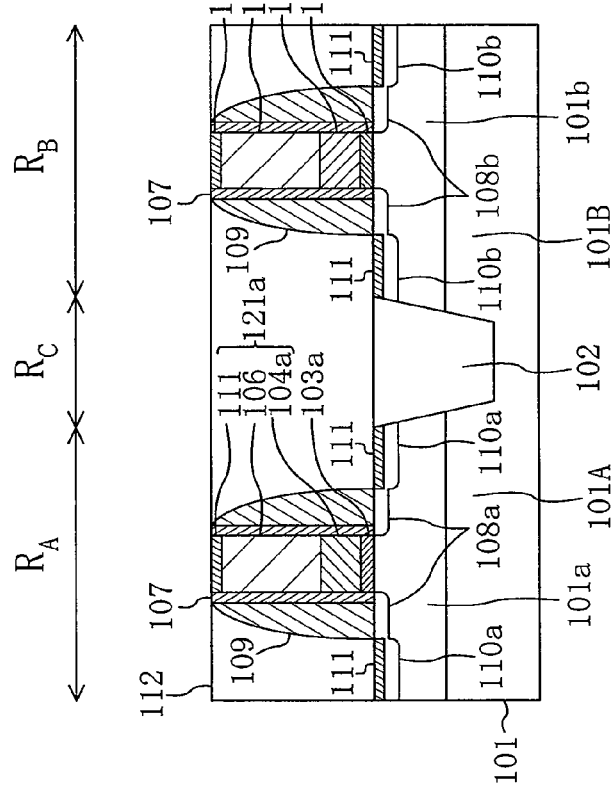

Next, as shown in FIGS. 9A and 9B, an interlayer insulating film 112 having a sufficient thickness (e.g., 200 nm or more) to cover the gate portions 121a and 121b is formed over the entire surface of the semiconductor substrate 101. Then, as shown in FIGS. 10A and 10B, the interlayer insulating film 112 is polished by, for example, chemical mechanical polishing (CMP), until the silicide layer 111 provided in the surface portions of the gate portions 121a and 121b is exposed. At this time, the silicide layer 111 in the surface portions of the gate portions 121a and 121b need not necessarily remain. The interlayer insulating film 112 may be polished, until the surface portion of the polysilicon film 106 constituting the gate portions 121a and 121b is exposed. Furthermore, when polishing the interlayer insulating film 112, dry etching may be used instead of CMP.

Then, after a metal film (not shown) made of, for example, Ti, Ni, Co, Pt, or the like and having a thickness of, for example, about 100 nm (a sufficient thickness to silicide the polysilicon film 106) is deposited on the gate portions 121a and 121b, heat treatment is conducted to react the polysilicon film 106 constituting the gate portions 121a and 121b with the metal film. Then, after removing an unreacted portion of the metal film, further heat treatment is conducted to form a third metal-containing conductive film 113 made of a silicide. As a result, it is possible to obtain the semiconductor device in this embodiment shown in FIGS. 1A and 1B, i.e., a semiconductor device, which includes an NMIS transistor having a first gate electrode 122a including a first metal-containing conductive film 104a and a third metal-containing conductive film 113, and a PMIS transistor having a second gate electrode 122b including a second metal-containing conductive film 104b and a third metal-containing conductive film 113.

In this embodiment, the polysilicon film 106 is completely silicided to form the third metal-containing conductive film 113 to be in contact with the first metal-containing conductive film 104a, the second metal-containing conductive film 104b, and the isolation region 102. In this embodiment, the polysilicon film 106 is silicided with the silicide layer 111 remaining in the surface portions of the gate portions 121a and 121b to simplify the manufacturing process. This presents no problem.

Finally, although not illustrated, contacts and interconnections for electrically connecting the gate electrodes 122a and 122b, and the source/drain regions 110a and 110b are formed by a well-known technique.

As described above, according to the first embodiment, the third metal-containing conductive film 113 being a part of each of the gate electrodes 122a and 122b, i.e., a conductive layer made of a material (e.g., a silicide) having lower resistance than polysilicon, is formed continuously and directly on the first metal-containing conductive film 104a, which constitutes the first gate electrode 122a, and the second metal-containing conductive film 104b, which constitutes the second gate electrode 122b, across the isolation region 102. Thus, an interconnection for electrically connecting the first gate electrode 122a and the second gate electrode 122b, i.e., an interconnection at the pn boundary on the isolation region 102 contains metal (i.e., the third metal-containing conductive film 113). This reduces the resistance of the interconnection at the pn boundary without taking remedies such as increasing the width of the interconnection at the pn boundary. This facilitates high integration of a semiconductor device including a DMG having a MIPS structure, and prevents problems such as disconnection of a silicide caused by concentration of current on the silicide on a polysilicon surface in a conventional MIPS structure, i.e., disconnection caused by an increase in resistance of an interconnection at a PN boundary.

According to the first embodiment, since the third metal-containing conductive film 113 is made of a silicide, the structure of the semiconductor device according to this embodiment can be easily obtained by siliciding silicon in the MIPS structure.

According to the first embodiment, in the MIS formation regions $R_A$ and $R_B$, not only the metal-containing conductive films 104a and 104b, which function as metal gate electrodes, but also the gate insulating films 103a and 103b are formed separately. This prevents deterioration of the gate insulating films 103a and 103b when patterning the metal-containing conductive films 104a and 104b.

In the first embodiment, a material including at least one of a Ta compound and a Hf compound is used for the first metal-containing conductive film 104a constituting the first gate electrode 122a of the NMIS transistor. The material is not limited thereto and may be a material having a work function of 4.55 eV or less.

In the first embodiment, a material including at least one of a Ti compound and a Ru compound is used for the second metal-containing conductive film 104b constituting the second gate electrode 122b of the PMIS transistor. The material is not limited thereto and may be a material having a work function of 4.65 eV or more.

Furthermore, in the first embodiment, the third metal-containing conductive film 113 is formed by siliciding the polysilicon film 106 with the silicide layer 111 remaining in the surfaces of the gate portions 121a and 121b. Instead, the third metal-containing conductive film 113 may be formed by siliciding the polysilicon film 106 with the surface of the polysilicon film 106 exposed by removing the silicide layer 111 in the surfaces of the gate portions 121a and 121b by CMP, etching, or the like.

Moreover, in the first embodiment, the silicide layer 111 may not be formed in the surfaces of the gate portions 121a and 121b. To be specific, a hard mask may be formed on the polysilicon film 106 in the steps shown in FIGS. 6C and 6D, the hard mask may be patterned with the polysilicon film 106 and the like in the steps shown in FIGS. 7A and 7B, the hard mask may prevent silicidation of the surface of the polysilicon film 106 in the steps shown in FIGS. 8C and 8D, and then, after removing the hard mask, the polysilicon film 106 may be silicided to form the third metal-containing conductive film 113.

Figure 11:
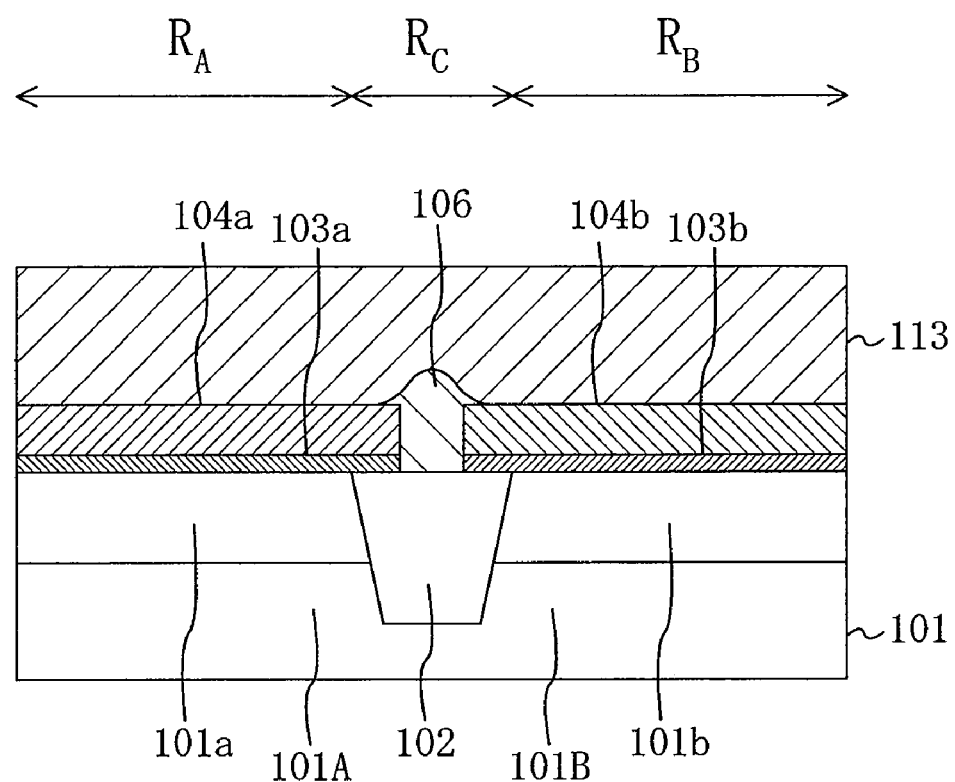
FIG. 11 illustrates a variation of a cross-sectional structure taken in the W direction in the semiconductor device according to the first embodiment of the present disclosure.

In the first embodiment, the third metal-containing conductive film 113 made of a silicide is formed to fill space on the isolation region 102 and between the first metal-containing conductive film 104a and the second metal-containing conductive film 104b, i.e., to be in contact with the isolation region 102. Instead, a shown in FIG. 11, which illustrates a variation of the cross-sectional structure of the semiconductor device of this embodiment in the W direction, the third metal-containing conductive film 113 may be formed by siliciding the polysilicon film 106 so that a part of the polysilicon film 106 remains between the isolation region 102 and the third metal-containing conductive film 113. That is, the third metal-containing conductive film 113 may not be in contact with the isolation region 102, as long as it is continuously formed from a top of the first metal-containing conductive film 104a to a top of the second metal-containing conductive film 104b. In other words, the polysilicon film 106, which fills the space on the isolation region 102 and between the first metal-containing conductive film 104a and the second metal-containing conductive film 104b, may not be silicided.

Second Embodiment

A semiconductor device and a method of manufacturing the device according to a second embodiment of the present disclosure will hereinafter be described with reference to the drawings.

Figure 12A:
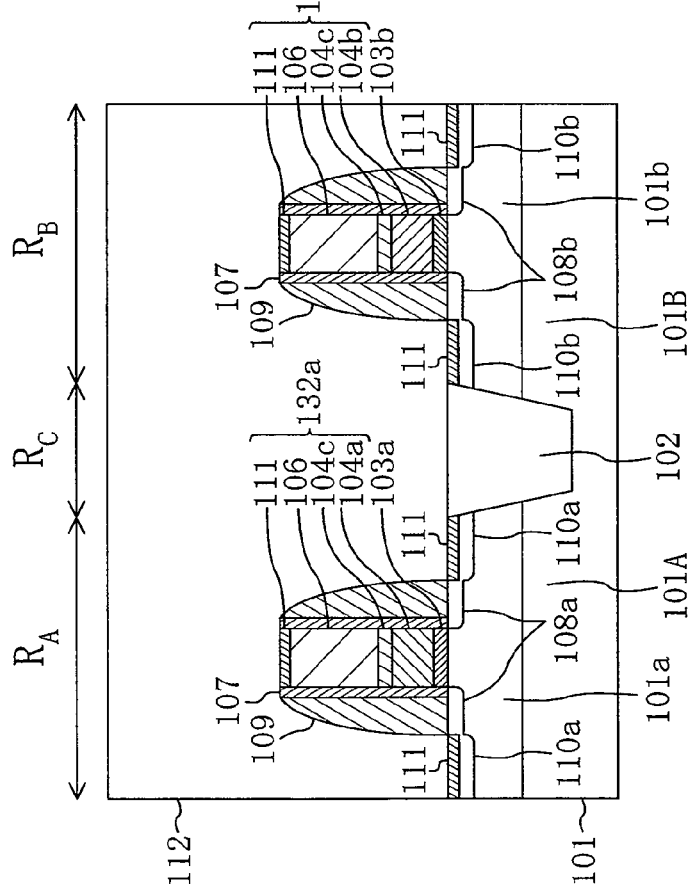
FIGS. 12A and 12B illustrate a cross-sectional structure of a semiconductor device according to a second embodiment of the present disclosure.
Figure 12B:
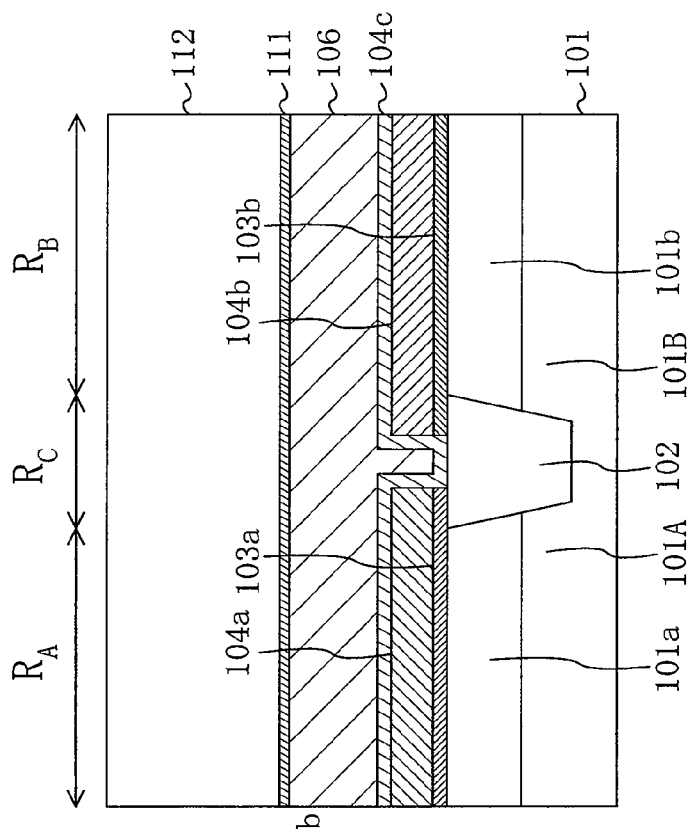

FIGS. 12A and 12B illustrate a cross-sectional structure of the semiconductor device according to the second embodiment of the present disclosure. FIG. 12A is a cross-sectional view taken in a gate length direction (L direction). FIG. 12B is a cross-sectional view taken in a gate width direction (W direction).

As shown in FIGS. 12A and 12B, an isolation formation region $R_C$ of a semiconductor substrate 101 is provided with an isolation region 102 including an STI for segmenting a first active region 101A, which is the semiconductor substrate 101 of an NMIS formation region $R_A$, and a second active region 101B, which is the semiconductor substrate 101 of a PMIS formation region $R_B$. A P-well region 101a is formed in the first active region 101A of the NMIS formation region $R_A$ surrounded by the isolation region 102, and an N-well region 101b is formed in the second active region 101B of the PMIS formation region $R_B$ surrounded by the isolation region 102. A first gate electrode 132a is formed on the first active region 101A with a first gate insulating film 103a interposed therebetween, and a second gate electrode 132b is formed on the second active region 101B with a second gate insulating film 103b interposed therebetween. The gate insulating films 103a and 103b are, for example, HfSiO films which are High-k films. The first gate electrode 132a of the NMIS transistor includes a first metal-containing conductive film 104a formed on the first gate insulating film 103a, a third metal-containing conductive film 104c formed on the first metal-containing conductive film 104a, a polysilicon film 106 formed on the third metal-containing conductive film 104c, and a silicide layer 111 formed in a surface portion of the polysilicon film 106. The second gate electrode 132b of the PMIS transistor includes a second metal-containing conductive film 104b formed on the second gate insulating film 103b, the third metal-containing conductive film 104c formed on the second metal-containing conductive film 104b, a polysilicon film 106 formed on the third metal-containing conductive film 104c, and a silicide layer 111 formed in the surface portion of the polysilicon film 106. The first metal-containing conductive film 104a is made of, for example, a material including at least one of a Ta compound and a Hf compound. The second metal-containing conductive film 104b is made of, for example, a material including at least one of a Ti compound and a Ru compound. The material of the third metal-containing conductive film 104c is not specified, as long as it has lower resistance than polysilicon. For example, a material may be used, which contains refractory metal and is similar to those of the first metal-containing conductive film 104a or the second metal-containing conductive film 104b.

Furthermore, as shown in FIGS. 12A and 12B, an insulating sidewall spacer 109 is formed on each side surface of the gate electrodes 132a and 132b with an insulating offset spacer 107 interposed therebetween. An N-type extension region (a shallow N-type source/drain region) 108a is formed under the insulating sidewall spacer 109 in the surface portion of the first active region 101A, and an N-type source/drain region (a deep N-type source/drain region) 110a is formed outside the N-type extension region 108a. A P-type extension region (a shallow P-type source/drain region) 108b is formed under the insulating sidewall spacer 109 in the surface portion of the second active region 101B, and a P-type source/drain region (a deep P-type source/drain region) 110b is formed outside the P-type extension region 108b. A silicide layer 111 is formed in the surface portions of the source/drain regions 110a and 110b. An interlayer insulating film 112 is formed over the entire surface of the semiconductor substrate 101 to bury the gate electrodes 132a and 132b.

One of the features of this embodiment is that the third metal-containing conductive film 104c, which is a part of each of the gate electrodes 132a and 132b, is continuously formed from a top of the first metal-containing conductive film 104a through a top of the isolation region 102 to a top of the second metal-containing conductive film 104b to be in contact with the first metal-containing conductive film 104a, the second metal-containing conductive film 104b, and the isolation region 102.

In this embodiment, as shown in FIG. 12B, in the W direction, the first metal-containing conductive film 104a constituting the first gate electrode 132a is formed over the first active region 101A and the adjacent edge of the isolation region 102, and the second metal-containing conductive film 104b constituting the second gate electrode 132b formed over the second active region 101B and the adjacent edge of the isolation region 102. That is, in the W direction, the first metal-containing conductive film 104a and the second metal-containing conductive film 104b are divided on the isolation region 102. Moreover, in this embodiment, the third metal-containing conductive film 104c is formed so that a recess remains in space on the isolation region 102 and between the first metal-containing conductive film 104a and the second metal-containing conductive film 104b. In addition, the polysilicon film 106 is formed to fill the recess.

A method of manufacturing the semiconductor device in this embodiment shown in FIGS. 12A and 12B will be described below. FIGS. 13A-13D, 14A-14D and 15A-15D are cross-sectional views illustrating steps in the method of manufacturing the semiconductor device according to the second embodiment of the present disclosure. FIGS. 13A, 13C, 14A, 14C, 15A and 15C are cross-sectional views taken in the L direction. FIGS. 13B, 13D, 14B 14D, 15B and 15D are cross-sectional views taken in the W direction.

Figure 13A:
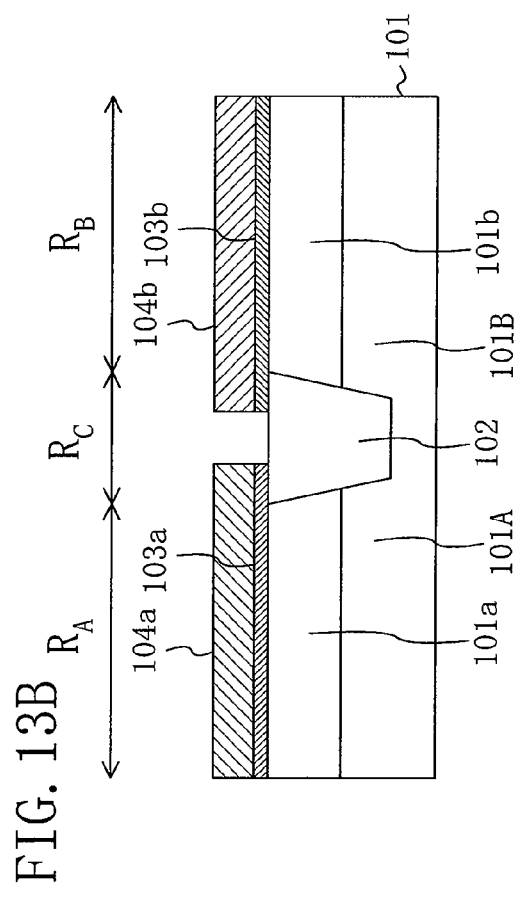
FIGS. 13A-13D are cross-sectional views illustrating steps in the method of manufacturing the semiconductor device according to the second embodiment of the present disclosure.
Figure 13B:
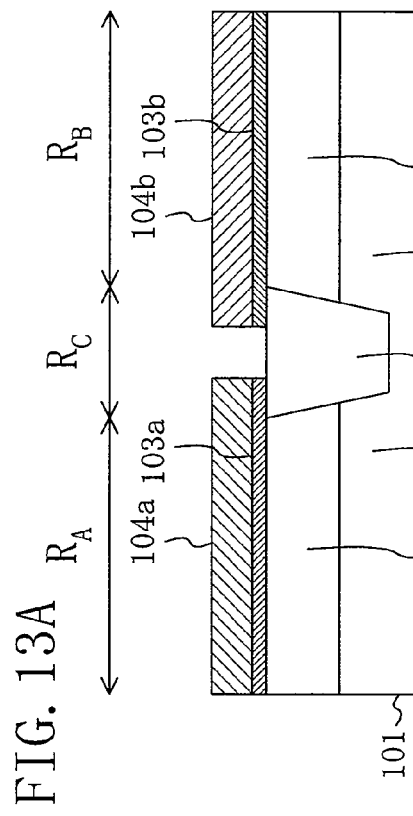

In this embodiment, after performing the steps in the method of manufacturing the semiconductor device according to the first embodiment shown in FIGS. 2A-2D, 3A-3D, 4A-4D and 5A-5D, the hard masks 105a and 105b are removed as shown in FIGS. 13A and 13B. As a result, the first metal-containing conductive film 104a is formed on the first active region 101A of the NMIS formation region $R_A$ with the first gate insulating film 103a interposed therebetween, and the second metal-containing conductive film 104b is formed on the second active region 101B of the PMIS formation region $R_B$ with the second gate insulating film 103b interposed therebetween.

Figure 13C:
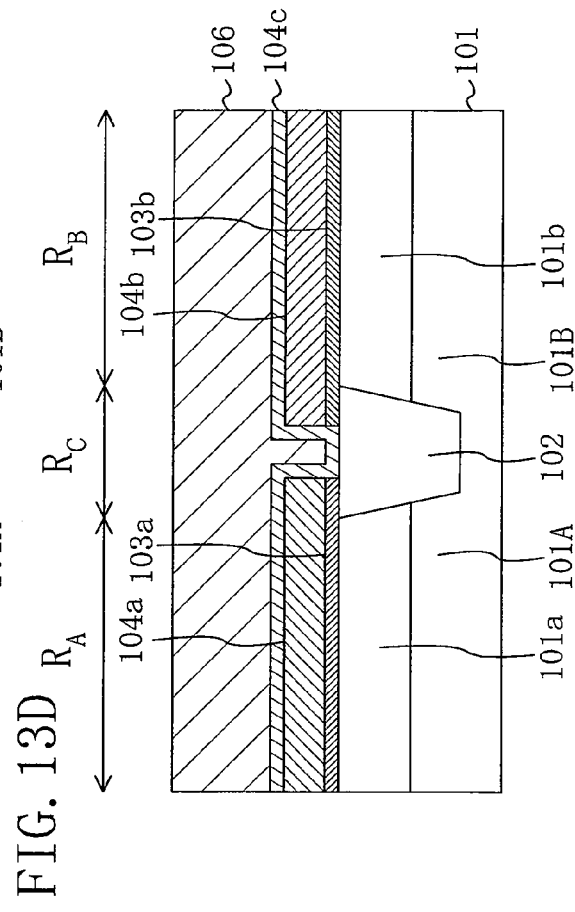
Figure 13D:
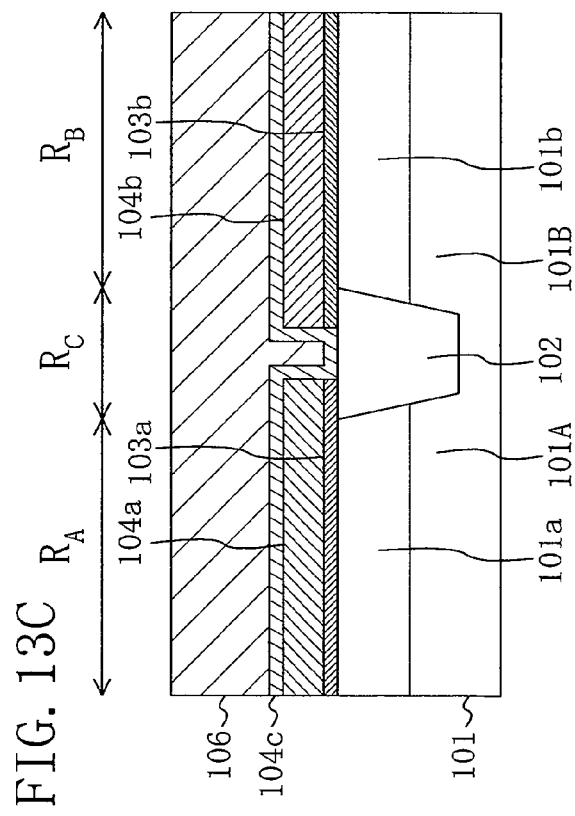

Next, as shown in FIGS. 13C and 13D, after a third metal-containing conductive film 104c with a thickness of about 10 nm, which is, for example, made of a material, which contains refractory metal and is similar to those of the metal-containing conductive film 104a or 104b, is formed over the entire surface of the semiconductor substrate 101; a polysilicon film 106 with a thickness of, for example, about 100 nm is formed on the third metal-containing conductive film 104c.

Figures 14A, 14B, 14C, 14D:
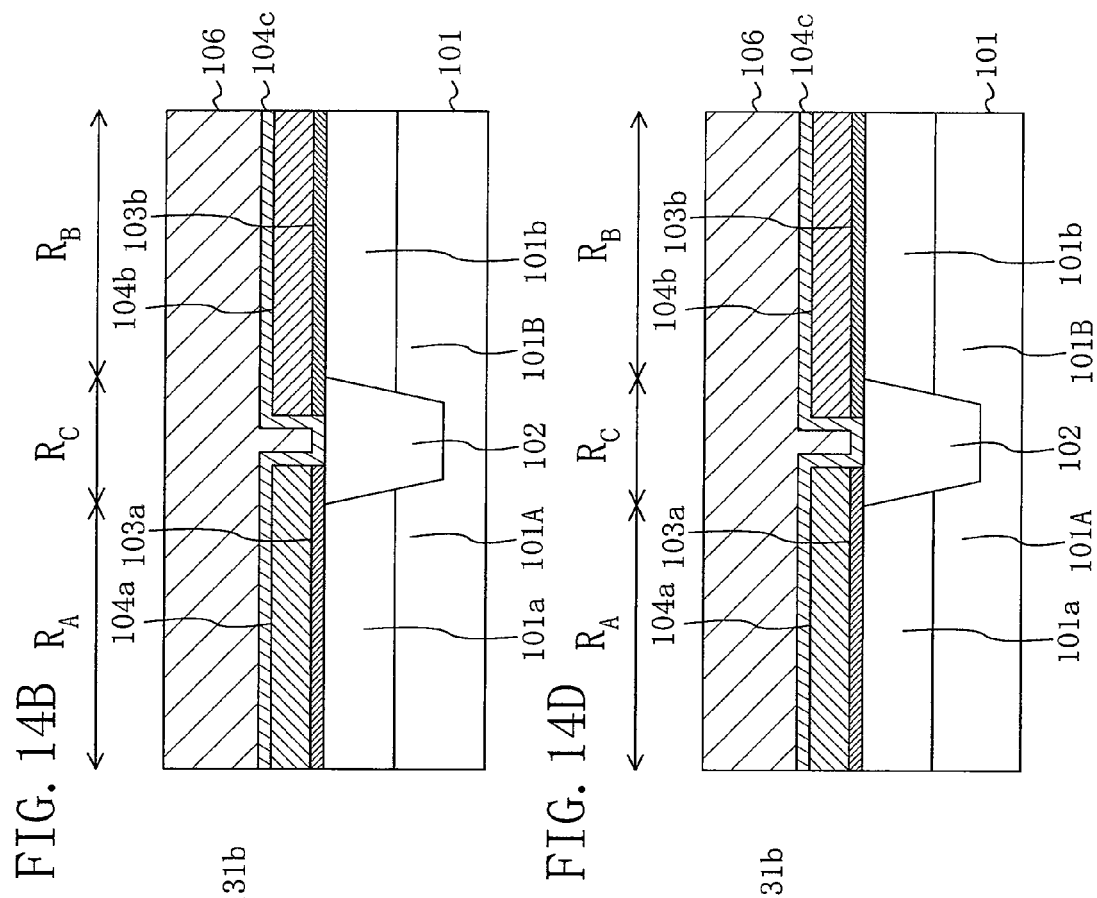
FIGS. 14A-14D are cross-sectional views illustrating steps in the method of manufacturing the semiconductor device according to the second embodiment of the present disclosure.

Then, as shown in FIGS. 14A and 14B, the polysilicon film 106 of the NMIS formation region $R_A$, the third metal-containing conductive film 104c of the NMIS formation region $R_A$, the first metal-containing conductive film 104a of the NMIS formation region $R_A$, the polysilicon film 106 of the PMIS formation region $R_B$, the third metal-containing conductive film 104c of the PMIS formation region $R_B$, and the second metal-containing conductive film 104b of the PMIS formation region $R_B$ are patterned by dry etching. As a result, a first gate portion 131a including the first metal-containing conductive film 104a, the third metal-containing conductive film 104c, and the polysilicon film 106 is formed on the first active region 101A with the first gate insulating film 103a interposed therebetween. A second gate portion 131b including the second metal-containing conductive film 104b, the third metal-containing conductive film 104c, and the polysilicon film 106 is formed on the second active region 101B with the second gate insulating film 103b interposed therebetween. At this time, as shown in FIG. 14B, the third metal-containing conductive film 104c and the polysilicon film 106 constituting the first gate portion 121a and the third metal-containing conductive film 104c and the polysilicon film 106 constituting the second gate portion 121b are formed integrally with the third metal-containing conductive film 104c and the polysilicon film 106 on the isolation region 102 interposed therebetween. Furthermore, in the steps shown in FIGS. 14A and 14B, the first gate insulating film 103a formed outside the first gate portion 131a, and the second gate insulating film 103b formed outside the second gate portion 131b are removed. In this embodiment, the materials of the metal-containing conductive films 104a and 104b, and the etching condition are selected appropriately. This enables continuous etching of the polysilicon film 106, the third metal-containing conductive film 104c, and the first and second metal-containing conductive films 104a and 104b in the same chamber, thereby forming the gate portions 131a and 131b by patterning at the same time.

Then, as shown in FIGS. 14C and 14D, after forming an insulating offset spacer 107 on each side surface of the gate portions 131a and 131b, the first active region 101A and the second active region 101B are ion-implanted using the gate portions 131a and 131b, and the insulating offset spacer 107 as masks, thereby forming an N-type extension region (a shallow N-type source/drain region) 108a and a P-type extension region (a shallow P-type source/drain region) 108b.

Next, as shown in FIGS. 15A and 15B, after forming an insulating sidewall spacer 109 on each side surface of the gate portions 131a and 131b with the insulating offset spacer 107 interposed therebetween, the first active region 101A and the second active region 101B are ion-implanted using the gate portions 131a and 131b, the insulating offset spacer 107, and the insulating sidewall spacer 109 as masks, thereby forming an N-type source/drain region (a deep N-type source/drain region) 110a and a P-type source/drain region (a deep P-type source/drain region) 110b.

Then, as shown in FIGS. 15C and 15D, the surface portion of the polysilicon film 106 constituting the gate portions 131a and 131b, and the surface portions of the source/drain regions 110a and 110b are silicided to form a silicide layer 111. This enables formation of the first gate electrode 132a and the second gate electrode 132b having the silicide layer 111 on the polysilicon film 106, and reduces the resistance of the gate electrodes 132a and 132b, and the source/drain regions 110a and 110b.

Next, an interlayer insulating film 112 having a sufficient thickness (e.g., 200 nm or more) to cover the gate electrodes 132a and 132b is formed over the entire surface of the semiconductor substrate 101. As a result, it is possible to obtain the semiconductor device in this embodiment shown in FIGS. 12A and 12B, i.e., a semiconductor device, which includes an NMIS transistor having a first gate electrode 132a including a first metal-containing conductive film 104a, a third metal-containing conductive film 104c, a polysilicon film 106, and a silicide layer 111; and a PMIS transistor having a second gate electrode 132b including a second metal-containing conductive film 104b, a third metal-containing conductive film 104c, a polysilicon film 106, and a silicide layer 111.

Finally, although not illustrated, contacts and interconnections for electrically connecting the gate electrodes 132a and 132b, and the source/drain regions 110a and 110b are formed by a well-known technique.

As described above, according to the second embodiment, the third metal-containing conductive film 104c being a part of each of the gate electrodes 132a and 132b, i.e., a conductive layer made of a material having lower resistance than polysilicon is formed continuously and directly on the first metal-containing conductive film 104a, which constitutes the first gate electrode 132a, and the second metal-containing conductive film 104b, which constitutes the second gate electrode 132b, across the isolation region 102. Thus, an interconnection for electrically connecting the first gate electrode 132a and the second gate electrode 132b, i.e., an interconnection at the pn boundary on the isolation region 102 contains metal (i.e., the third metal-containing conductive film 104c). This reduces the resistance of the interconnection at the pn boundary without taking remedies such as increasing the width of the interconnection at the pn boundary. This facilitates high integration of a semiconductor device including a DMG having a MIPS structure, and prevents problems such as disconnection of a silicide caused by concentration of current on the silicide on a polysilicon surface in a conventional MIPS structure, i.e., disconnection caused by an increase in resistance of an interconnection at a PN boundary.

According to the second embodiment, since the third metal-containing conductive film 104c is formed directly on the first metal-containing conductive film 104a constituting the first gate electrode 132a, and the second metal-containing conductive film 104b constituting the second gate electrode 132b to be in contact with the isolation region 102, thereby easily providing the structure of the semiconductor device according to this embodiment.

According to the second embodiment, the polysilicon film 106, which is a part of each of the first gate electrode 132a and the second gate electrode 132b, is formed on the third metal-containing conductive film 104c. As a result, the structure of the semiconductor device according to this embodiment can be easily obtained by inserting another metal between metal and silicon in the MIPS structure.

According to the second embodiment, in the MIS formation regions $R_A$ and $R_B$, not only the metal-containing conductive films 104a and 104b, which function as metal gate electrodes, but also the gate insulating films 103a and 103b are formed separately. This prevents deterioration of the gate insulating films 103a and 103b when patterning the metal-containing conductive films 104a and 104b.

In the second embodiment, a material including at least one of a Ta compound and a Hf compound is used for the first metal-containing conductive film 104a constituting the first gate electrode 132a of the NMIS transistor. The material is not limited thereto and may be a material having a work function of 4.55 eV or less.

In the second embodiment, a material including at least one of a Ti compound and a Ru compound is used for the second metal-containing conductive film 104b constituting the second gate electrode 132b of the PMIS transistor. The material is not limited thereto and may be a material having a work function of 4.65 eV or more.

Furthermore, in the second embodiment, since the third metal-containing conductive film 104c is continuously formed in the gate electrodes 132a and 132b including an interconnection at the pn boundary, only the surface portion of the polysilicon film 106 constituting the gate electrodes 132a and 132b is silicided to form the silicide layer 111. However, instead, the polysilicon film 106 may be completely silicided.

Figure 16:
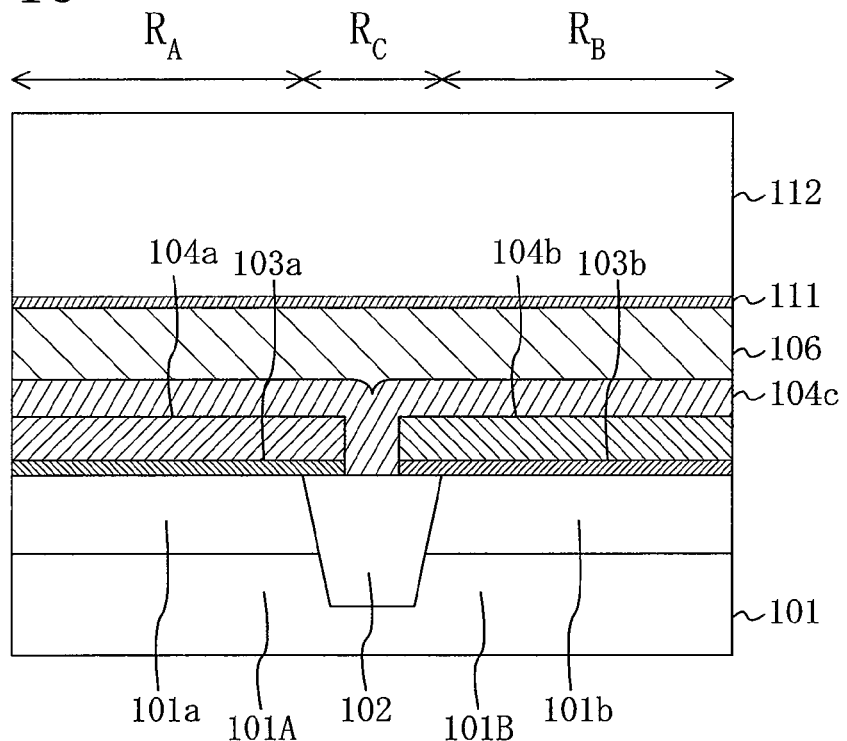
FIG. 16 is illustrates a variation of a cross-sectional structure taken in the W direction of the semiconductor device according to the second embodiment of the present disclosure.
Figure 17:
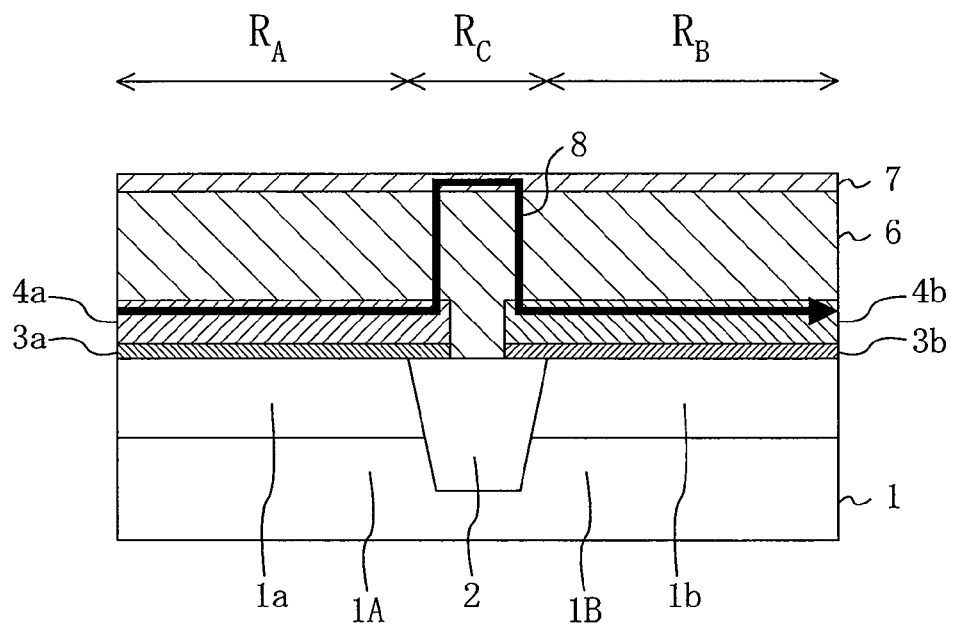
FIG. 17 is a cross-sectional view illustrating a semiconductor device shown in Non-Patent Document 1 and including a DMG having a MIPS structure

Moreover, in the second embodiment, the third metal-containing conductive film 104c is formed to be relatively thin so that a recess remains in space on the isolation region 102 and between the first metal-containing conductive film 104a and the second metal-containing conductive film 104b. However, instead, as shown in FIG. 16, which illustrates a variation of the cross-sectional structure of the semiconductor device of this embodiment in the W direction, the third metal-containing conductive film 104c may be formed to be relatively thick to fill the space on the isolation region 102 and between the first metal-containing conductive film 104a and the second metal-containing conductive film 104b. Note that, when the third metal-containing conductive film 104c is formed thin, there is an advantage of facilitating the processing of the third metal-containing conductive film 104c in the forming steps of the gate portions 131a and 131b by patterning shown in FIGS. 14A and 14B.

What is claimed is:

1. A semiconductor device comprising:
a first gate electrode formed on a first active region in a semiconductor substrate, and having a first metal-containing conductive film;
a second gate electrode formed on a second active region in the semiconductor substrate, and having a second metal-containing conductive film; and
an isolation region formed in the semiconductor substrate to segment the first active region and the second active region, wherein
a third metal-containing conductive film, which is a part of each of the first gate electrode and the second gate electrode, is continuously formed from a top of the first metal-containing conductive film through a portion above the isolation region to a top of the second metal-containing conductive film,
the third metal-containing conductive film is made of a silicide, and is formed by fully siliciding a silicon film in a thickness direction,
the third metal-containing conductive film has a thickness greater than those of the first metal-containing conductive film and the second metal-containing conductive film, and
the silicon film remains at an end of the first metal-containing conductive film between the first metal-containing conductive film and the third metal-containing conductive film.

2. The device of claim 1, wherein
the first metal-containing conductive film and the second metal-containing conductive film are formed on the isolation region to be spaced apart from each other, and
the third metal-containing conductive film is in contact with the isolation region.

3. The device of claim 2, wherein the third metal-containing conductive film is formed to fill space on the isolation region and between the first metal-containing conductive film and the second metal-containing conductive film.

4. The device of claim 1, wherein
the first metal-containing conductive film and the second metal-containing conductive film are formed on the isolation region to be spaced apart from each other, and
the silicon film remains between the third metal-containing conductive film and the isolation region.

5. The device of claim 1, wherein the silicide includes Ti, Ni, Co, or Pt.

6. The device of claim 1, further comprising:
a first high dielectric gate insulating film formed between the first active region and the first gate electrode; and
a second high dielectric gate insulating film formed between the second active region and the second gate electrode.

7. The device of claim 6, wherein the first high dielectric gate insulating film and the second high dielectric gate insulating film include HfSiO.

8. The device of claim 6, wherein the insulating sidewall spacer extends continuously from on a side surface of the first metal-containing conductive film to on a side surface of the first high dielectric gate insulating film.

9. The device of claim 1, wherein
the first gate electrode is a gate electrode of an N-type MIS transistor, and
the first metal-containing conductive film is made of a material having a work function of 4.55 eV or less.

10. The device of claim 1, wherein the first metal-containing conductive film is made of a material including at least one of a Ta compound and a Hf compound.

11. The device of claim 1, wherein
the second gate electrode is a gate electrode of a P-type MIS transistor, and
the second metal-containing conductive film is made of a material having a work function of 4.65 eV or more.

12. The device of claim 1, wherein the second metal-containing conductive film is made of a material including at least one of a Ti compound and a Ru compound.

13. The device of claim 1, wherein the second metal-containing conductive film has substantially a same thickness as the first metal-containing conductive film.

14. The device of claim 1, wherein the third metal-containing conductive film has a thickness five times or more as great as those of the first metal-containing conductive film and the second metal-containing conductive film.

15. The device of claim 14, wherein the silicide includes Pt.

16. The device of claim 14, wherein the silicide includes Ni and Pt.

17. The device of claim 1, wherein the silicide includes Pt.

18. The device of claim 1, wherein the silicide includes Ni and Pt.

19. The device of claim 1, wherein the third metal-containing conductive film is directly in contact with the first metal-containing conductive film and the second metal-containing conductive film.

20. The device of claim 1, wherein the first metal-containing conductive film includes metal not existing in the second metal-containing conductive film.

21. The device of claim 1, wherein
the first gate electrode does not include the second metal-containing conductive film, and
the second gate electrode does not include the first metal-containing conductive film.

22. The device of claim 1, wherein neither the first metal-containing conductive film nor the second metal-containing conductive film is a silicide.

23. The device of claim 1, wherein neither the first metal-containing conductive film nor the second metal-containing conductive film includes silicon.

24. The device of claim 1, wherein the third metal-containing conductive film directly contacts the first metal-containing conductive film.

25. The device of claim 24, wherein the third metal-containing conductive film is a single layer.

* * * * *